(12) United States Patent
Visconti

(10) Patent No.: US 10,984,847 B2
(45) Date of Patent: Apr. 20, 2021

(54) MEMORY MANAGEMENT FOR CHARGE LEAKAGE IN A MEMORY DEVICE

(71) Applicant: Micron Technology, Inc., Boise, ID (US)

(72) Inventor: Angelo Visconti, Appiano Gentile (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/441,722

(22) Filed: Jun. 14, 2019

(65) Prior Publication Data

US 2020/0395059 A1 Dec. 17, 2020

(51) Int. Cl.
*G11C 11/22* (2006.01)
*G11C 11/4091* (2006.01)

(52) U.S. Cl.
CPC ........ *G11C 11/2275* (2013.01); *G11C 11/221* (2013.01); *G11C 11/2259* (2013.01); *G11C 11/2273* (2013.01); *G11C 11/4091* (2013.01)

(58) Field of Classification Search
CPC .................................................. G11C 11/22
USPC .................................................. 365/185.21
See application file for complete search history.

(56) References Cited

U.S. PATENT DOCUMENTS 8,977,929 B2 3/2015 Thiruvengadam et al.
9,589,655 B1 3/2017 Kim et al.
2014/0153338 A1 6/2014 Byeon et al.
2015/0309869 A1 10/2015 Mittelholzer et al.
2017/0352397 A1* 12/2017 Guo .................... G11C 11/2275
2019/0130960 A1 5/2019 Kim

FOREIGN PATENT DOCUMENTS

KR 20180123393 A 11/2018

OTHER PUBLICATIONS

ISA/KR, International Search Report and written Opinion of the International Searching Authority, Int'l Appl. No. PCT/US2020/032100, dated Aug. 27, 2020, Korean Intellectual Property Office, Seo-gu, Daejeon, Republic of Korea, 11 pgs.

* cited by examiner

*Primary Examiner* — Jason Lappas
(74) *Attorney, Agent, or Firm* — Holland & Hart LLP

(57) ABSTRACT

Methods, systems, and devices for memory management associated with charge leakage in a memory device are described. A memory device may identify a charge leakage associated with one or more memory cells or access lines, and may determine whether to invert a logic state stored by a memory cell or a set of memory cells to improve the likelihood that the memory cells are read properly in the presence of charge leakage. In some examples, the memory device may also store an indication that the complement of the detected logic state was written, such as a bit flip indication, which may correspond to one memory cell or a set of memory cells.

19 Claims, 9 Drawing Sheets

US 10,984,847 B2

1

MEMORY MANAGEMENT FOR CHARGE LEAKAGE IN A MEMORY DEVICE

BACKGROUND

The following relates generally to a system that includes at least one memory device and more specifically to memory management for charge leakage in a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

In some memory devices, charge may leak from one portion of the memory device to another due to manufacturing defects, component breakdown, changes in composition, or other causes. In some examples, charge leakage may affect performance of a memory device.

2

Figure 8:
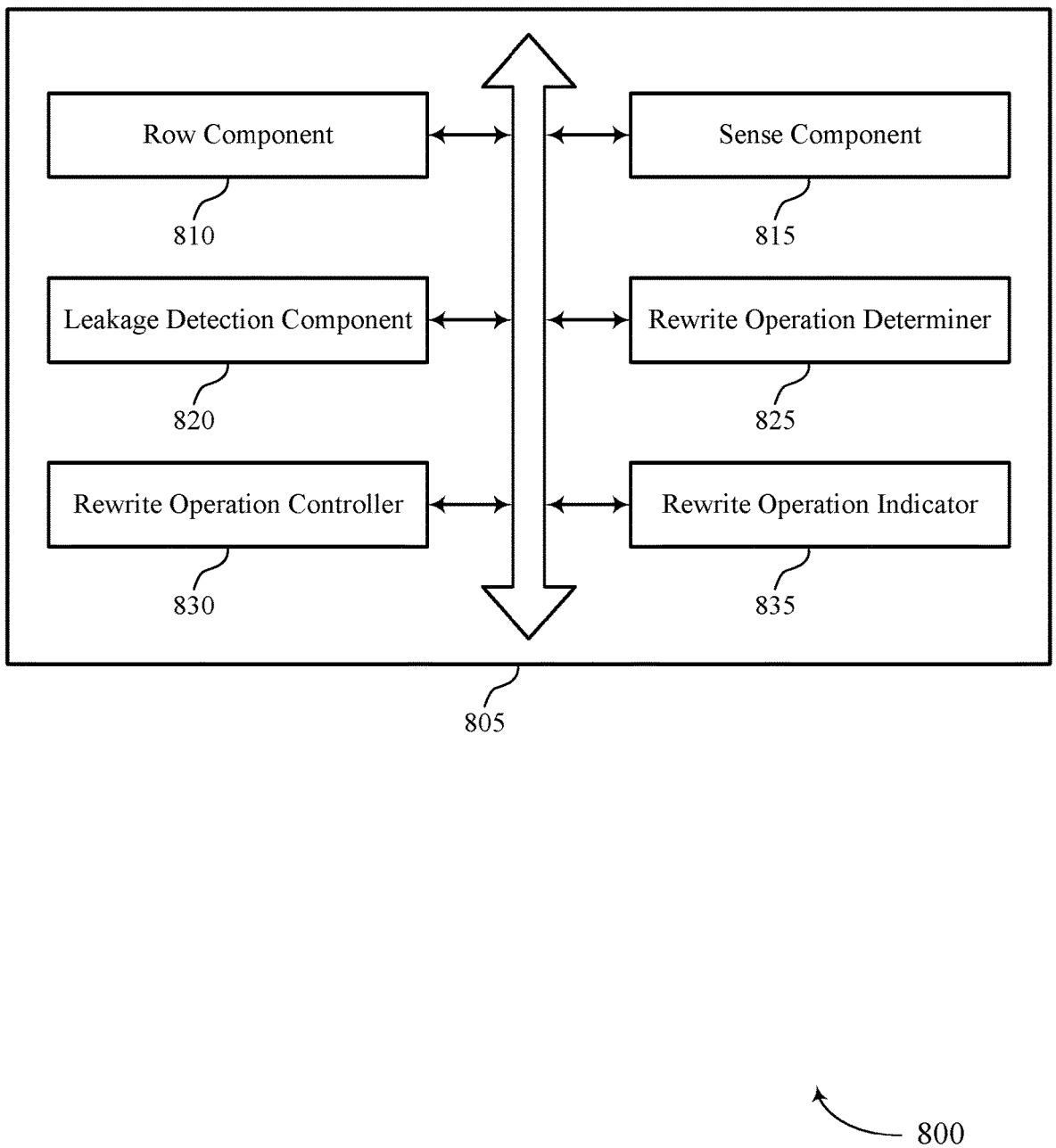

FIG. 8 shows a block diagram of a memory device that supports memory management for charge leakage in accordance with examples as disclosed herein.

Figure 9:
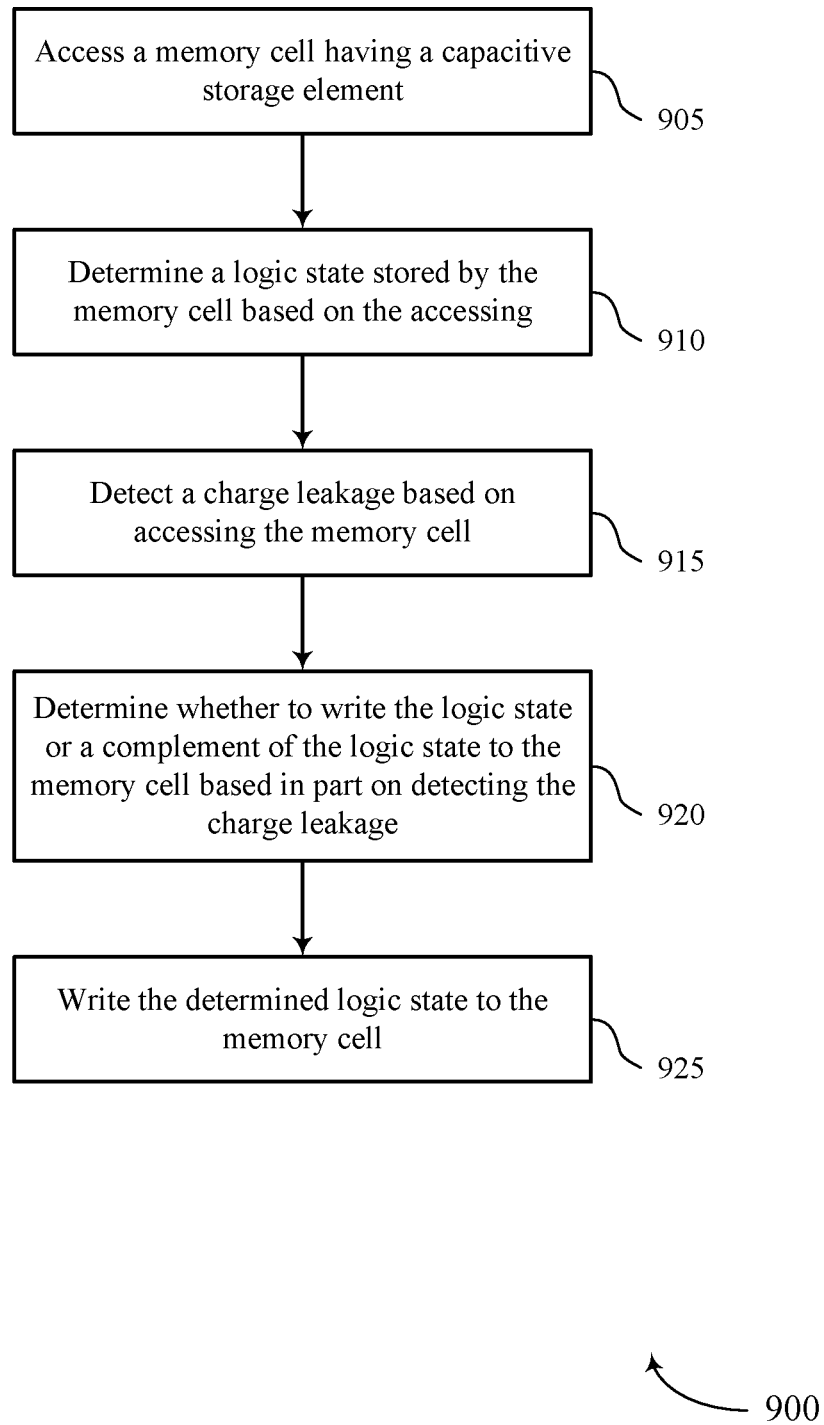

FIG. 9 shows a flowchart illustrating a method or methods that support memory management for charge leakage in accordance with aspects of the present disclosure.

DETAILED DESCRIPTION

In some memory devices, charge leakage may adversely affect the ability of a memory device to determine a logic state stored by a memory cell. For example, charge leakage in a memory device may result in detecting or otherwise identifying a charge transfer that is greater than a charge transfer otherwise associated with a particular logic state previously stored to a memory cell, such as detecting a voltage of a signal line as being lower than a corresponding voltage when charge leakage is not present. In some examples, charge leakage may reduce a read margin of a memory device, or may be associated with reading an incorrect logic state from a memory cell (e.g., a logic state different than what had been stored at the memory cell). These effects may, for example, be relevant to capacitive or other charge-storing memory technologies where memory cells may store different amounts or polarities of charge or polarization to store different logic states.

In one example, memory cells of a memory device may be configured to store (e.g., in a capacitive memory element, in a ferroelectric memory element) a first logic state that is associated with a first amount of charge transfer, or a second logic state that is associated with a second amount of charge transfer that is greater than the first amount of charge transfer, or both. The first amount of charge transfer may refer to or otherwise correspond to a charge transfer to or from a memory cell that stored the first logic state during a read operation, a first amount of charge stored at a memory cell, or a first polarity of charge stored at a memory cell, or the first amount of charge transfer may generally correspond to a relatively low current logic state.

The second amount of charge transfer may refer to or otherwise correspond to an amount of charge transfer to or from a memory cell that stored the second logic state during a read operation, a second amount of charge stored at a memory cell, or a second polarity of charge stored at a memory cell, or the second amount of charge transfer may generally correspond to a relatively high current logic state. During a read operation of a memory cell that stores the first logic state, the first amount of charge transfer may be detected or otherwise identified by a sense component to determine that the memory cell stored the first logic state. During a read operation of a memory cell that stores the second logic state, the second amount of charge transfer may be detected or otherwise identified by a sense component to determine that the memory cell stored the second logic state.

In the presence of charge leakage, a memory device (e.g., a sense component within the memory device) may detect a higher charge transfer than would normally be associated with a particular logic state, which may be partially representative of the charge transfer from the memory cell storing the logic state and partially representative of the charge leakage. In other words, charge leakage may be superimposed on the charge transfer normally associated with a particular logic state (e.g., associated with a read operation for the logic state). In some cases, the superimposed charge leakage may reduce the read margin for reading a memory cell storing the first logic state (e.g., normally associated with a relatively lower charge transfer), or may cause the memory device to incorrectly detect the second logic state (e.g., associated with a higher charge transfer during a read operation) from a memory cell that was written with the first logic state.

In accordance with the techniques disclosed herein, a memory device may identify a charge leakage associated with one or more memory cells or access lines, and may determine whether to intentionally invert a logic state stored by one or more memory cells to improve the likelihood of proper logic state detection in the presence of charge leakage. For example, a memory device may determine a logic state stored by a memory cell during an access operation (e.g., during a read portion of the access operation, during a write portion of the access operation), and also detect whether the memory cell or relevant access line is associated with a charge leakage (e.g., during a leakage detection portion of the access operation).

In some cases, the memory device may determine to write a complement of the determined logic state (e.g., a different logic state than associated with a read or write portion of an access operation, a complementary logic state, an inverted logic state, an opposite logic state) to the memory cell based in part on detecting the charge leakage. In some examples, determining to write the complement of the logic state may be based on the detected logic state being associated with a first amount of charge transfer, and the complement of the logic state being associated with a second amount of charge transfer that is greater than the first amount of charge transfer. In some cases, the memory device may subsequently write the complement of the logic state to the memory cell (e.g., during a rewrite portion of the access operation).

Accompanying the writing of a complementary logic state to the memory cell, the memory device may also store an indication that the complement of the detected logic state was written, such as a bit flip indication, where such an indication may correspond to a set of one or more memory cells that include the memory cell for which an associated charge leakage was detected. For example, the memory device may store such an indication to track whether a memory cell, or set (e.g., a row or page) of memory cells, has been programmed with a direct logic status or a complementary logic status (e.g., a flipped status). Such an indication may be used in a subsequent read operation to properly interpret the changed logic state of the one or more memory cells of the set when reading information of the memory device (e.g., directly interpreting the logic state stored by the memory cell or inverting or otherwise changing the interpretation of the logic state stored by the memory cell).

Thus, detected charge leakage in a memory device may be accounted for by changing a logic state stored by the memory cell (e.g., during a rewrite operation), which may avoid incorrectly interpreting information stored by the memory cell that may otherwise result from charge leakage, or may avoid or reduce the effects of narrowed read margins that may result from charge leakage. In some examples, such techniques may support improved performance in a memory device, such as extending cycling-to-fail (CTF) performance, relaxing bit error rate (BER) requirements, and other benefits.

Figure 1:
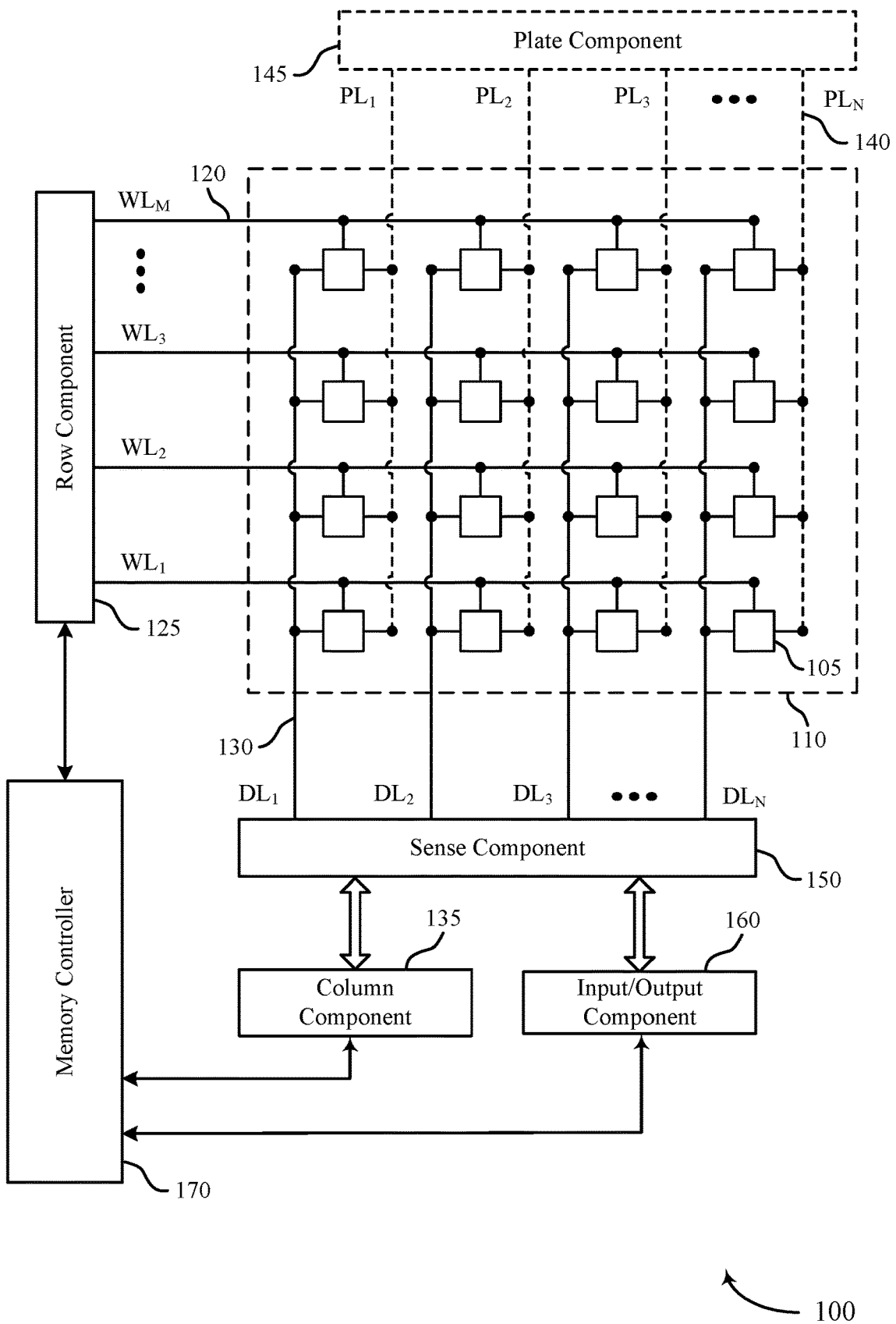
FIG. 1 illustrates an example of a memory device that supports memory management for charge leakage in accordance with examples as disclosed herein.
Figure 2:
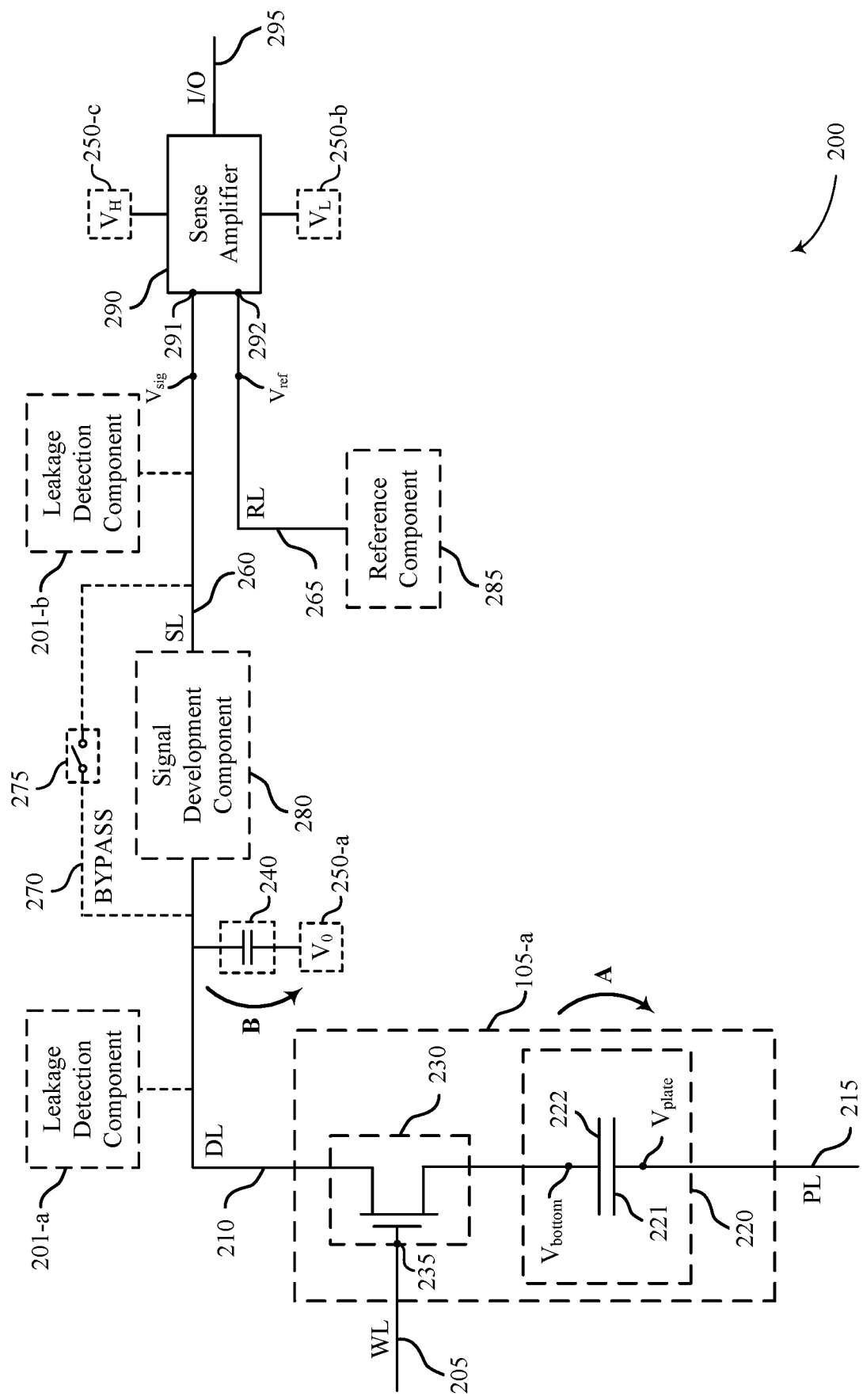
FIG. 2 illustrates an example circuit that supports memory management for charge leakage in accordance with examples as disclosed herein.

Features of the disclosure are initially described in the context of a memory device, circuitry, and memory cell characteristics with reference to FIGS. 1-3. Features of the disclosure are further described in the context of an example circuit and corresponding access operation with reference to FIGS. 4-5. These and other features of the disclosure are further illustrated by and described with reference to apparatus diagrams and flowcharts that relate to memory management for charge leakage in a memory device as described with references to FIGS. 6-9.

FIG. 1 illustrates an example of a memory device 100 that supports memory management for charge leakage in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. In some examples, the memory cells 105 may include a capacitive storage element, a ferroelectric storage element, or other types of storage elements (e.g., memory elements, charge storage elements, polarization storage elements).

The set of memory cells 105 may be part of a memory section 110 of the memory device 100 (e.g., including an array of memory cells 105), where, in some examples, a memory section 110 may refer to a contiguous tile of memory cells 105 (e.g., a contiguous set of elements of a semiconductor chip). In some examples, a memory section 110 may refer to the smallest set of memory cells 105 that may be biased in an access operation, or a smallest set of memory cells 105 that share a common electrical node (e.g., a common plate line, a set of plate lines that are biased to a common voltage). Although only a single memory section 110 of the memory device 100 is shown, various examples of a memory device that supports the described techniques may have a set of one or more memory sections 110. In one illustrative example, a memory device 100 may include 32 "banks" and each bank may include 32 sections. Thus, a memory device 100 according to the illustrative example may include 1,024 memory sections 110.

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105). Ferroelectric materials have non-linear polarization properties including those discussed in further detail with reference to FIG. 3.

A memory device 100 may include a three-dimensional (3D) memory array, where a plurality of two-dimensional (2D) memory arrays (e.g., decks, levels) are formed on top of one another. In various examples, such arrays may be divided into a set of memory sections 110, where each memory section 110 may be arranged within a deck or level, distributed across multiple decks or levels, or any combination thereof. Such arrangements may increase the number of memory cells 105 that may be placed or created on a single die or substrate as compared with 2D arrays, which in turn may reduce production costs or increase the performance of a memory device 100, or both. The decks or levels may be separated by an electrically insulating material. Each deck or level may be aligned or positioned so that memory cells 105 may be approximately aligned with one another across each deck, forming a stack of memory cells 105.

In the example of memory device 100, each row of memory cells 105 of the memory section 110 may be coupled with one of a set of first access lines 120 (e.g., a word line (WL), such as one of $WL_1$ through $WL_M$, a selection line), and each column of memory cells 105 may be coupled with one of a set of second access lines 130 (e.g., a digit line (DL), such as one of $DL_1$ through $DL_N$). In some examples, a row of memory cells 105 of a different memory section 110 (not shown) may be coupled with one of a different plurality of first access lines 120 (e.g., a word line different from $WL_1$ through $WL_M$), and a column of memory cells 105 of the different memory section 110 may be coupled with one of a different plurality of second access lines 130 (e.g., a digit line different from $DL_1$ through $DL_N$). In some cases, first access lines 120 and second access lines 130 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) an access line 120 and an access line 130. This intersection may be referred to as an address of a memory cell 105. A target or selected memory cell 105 may be a memory cell 105 located at the intersection of an energized or otherwise selected access line 120 and an energized or otherwise selected access line 130. In other words, an access line 120 and an access line 130 may be energized or otherwise selected to access (e.g., read, write, rewrite, refresh) a memory cell 105 at their intersection. Other memory cells 105 that are in electronic communication with (e.g., connected to) the same access line 120 or 130 may be referred to as untargeted or non-selected memory cells 105.

In some architectures, the logic storing component (e.g., a capacitive storage element, a ferroelectric storage element, another storage element) of a memory cell 105 may be electrically isolated (e.g., selectively isolated) from a second access line 130 by a cell selection component, which, in some examples, may be referred to as a switching component or a selector device of or otherwise associated with the memory cell 105. A first access line 120 may be coupled with the cell selection component (e.g., via a control node or terminal of the cell selection component), and may control the cell selection component of the memory cell 105. For example, the cell selection component may be a transistor and the first access line 120 may be coupled with a gate of the transistor (e.g., where a gate node of the transistor may be a control node of the transistor). Activating the first access line 120 of a memory cell 105 may result in an electrical connection or closed circuit between the logic storing component of the memory cell 105 and its corresponding second access line 130. The second access line 130 may then be accessed to read or write the memory cell 105.

In some examples, memory cells 105 of the memory section 110 may also be coupled with one of a plurality of third access lines 140 (e.g., a plate line (PL), such as one of $PL_1$ through $PL_N$). Although illustrated as separate lines, in some examples, the plurality of third access lines 140 may represent or be otherwise functionally equivalent with a common plate line, a common plate, or other common node of the memory section 110 (e.g., a node common to each of the memory cells 105 in the memory section 110), or other common node of the memory device 100. In some examples, the plurality of third access lines 140 may couple memory cells 105 with one or more voltage sources for various sensing or writing operations including those described herein. For example, when a memory cell 105 employs a capacitor for storing a logic state, a second access line 130 may provide access to a first terminal or a first plate of the capacitor, and a third access line 140 may provide access to a second terminal or a second plate of the capacitor (e.g., a terminal associated with an opposite plate of the capacitor as opposed to the first terminal of the capacitor, a terminal otherwise on the opposite side of a capacitance from the first terminal of the capacitor). In some examples, memory cells 105 of a different memory section 110 (not shown) may be coupled with one of a different plurality of third access lines 140 (e.g., a set of plate lines different from $PL_1$ through $PL_N$, a different common plate line, a different common plate, a different common node).

The plurality of third access lines 140 may be coupled with a plate component 145, which may control various operations such as activating one or more of the plurality of third access lines 140, or selectively coupling one or more of the plurality of third access lines 140 with a voltage source or other circuit element. Although the plurality of third access lines 140 of the memory device 100 are shown as substantially parallel with the plurality of second access lines 130, in other examples, a plurality of third access lines 140 may be substantially parallel with the plurality of first access lines 120, or in any other configuration (e.g., a common planar conductor, a common plate layer).

Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 120, or with (e.g., between) a memory cell 105 and an access line 130. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

Access operations such as reading, writing, rewriting, and refreshing may be performed on a memory cell 105 by activating or selecting a first access line 120, a second access line 130, or a third access line 140 coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled through a row component 125 (e.g., a row decoder), a column component 135 (e.g., a column decoder), or a plate component 145 (e.g., a plate driver), or a combination thereof. For example, a row component 125 may receive a row address from the memory controller 170 and activate the appropriate first access line 120 based on the received row address. Similarly, a column component 135 may receive a column address from the memory controller 170 and activate the appropriate second access line 130. Thus, in some examples, a memory cell 105 may be accessed by activating a first access line 120 and a second access line 130. In some examples, such access operations may be accompanied by a plate component 145 biasing one or more of the third access lines 140 (e.g., biasing one of the third access lines 140 of the memory section 110, biasing all of the third access 140 of the memory section, biasing a common plate line of the memory section 110 or the memory device 100, biasing a common node of the memory section 110 or the memory device 100), which may be referred to as "moving the plate" of memory cells 105, the memory section 110, or the memory device 100.

In some examples, the memory controller 170 may control operations (e.g., read operations, write operations, rewrite operations, refresh operations, discharge operations, voltage adjustment operations, dissipation operations, equalization operations) of memory cells 105 through the various components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired access line 120 and access line 130. The memory controller 170 may also generate or control various voltages or currents used during the operation of memory device 100. Although only a single memory controller 170 is shown, other examples of a memory device 100 may have more than one memory controller 170 (e.g., a memory controller 170 for each of a set of memory sections 110 of a memory device, a memory controller 170 for each of a number of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions or different functions.

Although the memory device 100 is illustrated as including a single row component 125, a single column component 135, and a single plate component 145, other examples of a memory device 100 may include different configurations to accommodate a set of memory sections 110. For example, in various memory devices 100 a row component 125 may be shared among a set of memory sections 110 (e.g., having subcomponents common to all of the set of memory sections 110, having subcomponents dedicated to respective ones of the set of memory sections 110), or a row component 125 may be dedicated to one memory section 110 of a set of memory sections 110. Likewise, in various memory devices 100, a column component 135 may be shared among a set of memory sections 110 (e.g., having subcomponents common to all of the set of memory sections 110, having subcomponents dedicated to respective ones of the set of memory sections 110), or a column component 135 may be dedicated to one memory section 110 of a set of memory sections 110. Additionally, in various memory devices 100, a plate component 145 may be shared among a set of memory sections 110 (e.g., having subcomponents common to all of the set of memory sections 110, having subcomponents dedicated to respective ones of the set of memory sections 110), or a plate component 145 may be dedicated to one memory section 110 of a set of memory sections 110.

In general, the amplitude, shape, or duration of an applied voltage, current, or charge may be adjusted or varied, and may be different for the various operations discussed for operating the memory device 100. Further, one, multiple, or all memory cells 105 within memory device 100 may be accessed simultaneously. For example, each of the memory cells 105 that share a common access line 120, or some subset of the memory cells 105 that share a common access line 120 (e.g., a common cell selection line), may be accessed simultaneously (e.g., according to a memory row access arrangement, according to a "page" access arrangement, according to a set of access lines 130 or columns that may be accessed or sensed simultaneously). In another example, multiple or all memory cells 105 of memory device 100 may be accessed simultaneously during a reset operation in which all memory cells 105, or a group of memory cells 105 (e.g., the memory cells 105 of a memory section 110), are set to a single logic state.

A memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge transfer through or from the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of the logic state stored by the memory cell 105 to one or more components (e.g., to the column component 135, the input/output component 160, the memory controller 170). In various memory devices 100, a sense component 150 may be shared among a set of memory sections 110 (e.g., having subcomponents common to all of the set of memory sections 110, having subcomponents dedicated to respective ones of the set of memory sections 110), or a sense component 150 may be dedicated to one memory section 110 of a set of memory sections 110.

In some examples, during or after accessing a memory cell 105, the storage element of memory cell 105 may discharge, or otherwise permit electrical charge or current to flow via its corresponding access lines 120, 130, or 140. Such charge or current may result from biasing, or applying a voltage, to the memory cell 105 from one or more voltage sources or supplies (not shown) of the memory device 100, where such voltage sources or supplies may be part of a row component 125, a column component 135, a plate component 145, a sense component 150, a memory controller 170, or some other component (e.g., a biasing component). In some examples, charge sharing between a selected memory cell 105 and an access line 130 may cause a change in the voltage of the access line 130, which the sense component 150 may compare to a reference voltage to determine the stored logic state of the memory cell 105.

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of access lines 130 connected to the sense component 150. For example, a sense component 150 may include a separate sensing circuit (e.g., a separate or duplicated sense amplifier, a separate or duplicated signal development component) for each of a set of access lines 130 coupled with the sense component 150, such that a logic state may be separately detected for a respective memory cell 105 coupled with a respective one of the set of access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120, 130, or 140 of a memory section 110).

The sense component 150 may be included in a device that includes the memory device 100. For example, the sense component 150 may be included with other read and write circuits, decoding circuits, or register circuits of the memory that may be coupled to the memory device 100. In some examples, the detected logic state of a memory cell 105 may be output through a column component 135 or an input/output component 160 as an output. In some examples, a sense component 150 may be part of a column component 135 or a row component 125. In some examples, a sense component 150 may be connected to or otherwise in electronic communication with a column component 135 or a row component 125.

Although a single sense component 150 is shown, a memory device 100 (e.g., a memory section 110 of a memory device 100) may include more than one sense component 150. For example, a first sense component 150 may be coupled with a first subset of access lines 130 and a second sense component 150 may be coupled with a second subset of access lines 130 (e.g., different from the first subset of access lines 130). In some examples, such a division of sense components 150 may support parallel (e.g., simultaneous) operation of multiple sense components 150. In some examples, such a division of sense components 150 may support matching sense components 150 having different configurations or characteristics to particular subsets of the memory cells 105 of the memory device (e.g., supporting different types of memory cells 105, supporting different characteristics of subsets of memory cells 105, supporting different characteristics of subsets of access lines 130). Additionally or alternatively, two or more sense components 150 may be coupled with a same set of access lines 130 (e.g., for component redundancy). In some examples, such a configuration may support maintaining functionality to overcome a failure or otherwise poor operation of one of the redundant sense components 150. In some examples, such a configuration may support the ability to select one of the redundant sense components 150 for particular operational characteristics (e.g., as related to power consumption characteristics, as related to access speed characteristics for a particular sensing operation, as related to operating memory cells 105 in a volatile mode or a non-volatile mode).

In some memory architectures, accessing the memory cell 105 may degrade or destroy the stored logic state, and rewrite or refresh operations may be performed to return the original logic state to memory cell 105. In DRAM or FeRAM, for example, a capacitor of a memory cell 105 may be partially or completely discharged during a sense operation, thereby corrupting the logic state that was stored in the memory cell 105. Thus, in some examples, the logic state stored in a memory cell 105 may be rewritten after an access operation. Further, activating a single access line 120, 130, or 140 may result in the discharge of all memory cells 105 coupled with the activated access line 120, 130, or 140. Thus, several or all memory cells 105 coupled with an access line 120, 130, or 140 associated with an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. However, in some examples, refreshing the logic state of the memory cell 105 may or may not be needed in the absence or presence of other access operations. For example, the logic state stored by a memory cell 105 may be refreshed at periodic intervals by applying an appropriate write, rewrite, refresh, or equalization pulse or bias to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 120, second access line 130, or third access line 140 (e.g., via a memory controller 170). In other words, a logic state may be stored in a memory cell 105. Row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element).

In some examples, the memory device 100 may include a set of memory sections 110. Each of the memory sections 110 may include a set of memory cells 105 coupled with or between one of a set of second access lines 130 and one of a set of third access lines 140 (e.g., of the respective memory section 110). Each of the memory cells 105 may include a cell selection component configured to selectively couple the memory cell 105 with the associated second access line 130 or the associated third access line 140 (e.g., of the respective memory section 110). In some examples, each of the cell selection components may be coupled (e.g., at a control node or a control terminal of the respective cell selection component) with a respective one of the first access lines 120 (e.g., of the memory section 110), which may be used to activate or deactivate the particular cell selection component.

Access operations, which may include read operations, write operations, rewrite operations, refresh operations, or various combinations thereof, may be performed on selected memory cells 105 of a memory section 110. In some examples, access operations may be associated with biasing the second access line 130 or the third access line 140 associated with a selected memory cell 105. During the access operations, cell selection components for the selected memory cell 105 may be activated, such that selected memory cell 105 may be selectively coupled with the second access line 130 or the third access line 140. Thus, signals associated with the access operations (e.g., a voltage associated with an access operation, a charge associated with an access operation, a current associated with an access operation) may pass to, from, or through the selected memory cell 105 as a result of the biasing of the second access line 130 or the third access line 140 for the access operation.

In some examples, charge may leak from one portion of the memory device 100 or memory section 110 to another. Possible causes of leakage include manufacturing defects, component breakdown (e.g., thin film transistor (TFT) breakdown or leakage), memory cell wear-out mechanisms (e.g., stress-induced leakage current (SILC), breakdown (BD) current), changes in composition, or other causes. For example, charge may leak across a cell selection component of a memory cell 105, across a dielectric material of a capacitive storage element, from one access line of the memory device 100 to another (e.g., from an access line 130 to another access line 120, 130, or 130), across transistors that are meant to be deactivated (e.g., across transistors that are switched to a non-conductive state), and others. In some examples, charge leakage may adversely affect performance of the memory device 100 (e.g., by causing a different logic state to be detected when reading a memory cell than was previously written to the memory cell). Therefore, in accordance with the techniques disclosed herein, the memory device 100 (e.g., the memory controller 170) may be configured to determine whether to store a direct logic state, or a complementary logic state, to a memory cell 105 or a set of memory cells 105 based on a detection of charge leakage in the memory device 100.

FIG. 2 illustrates an example circuit 200 that supports memory management for charge leakage in accordance with examples as disclosed herein. Circuit 200 includes a memory cell 105-a, which may be an example of a memory cell 105 described with reference to FIG. 1. Circuit 200 also includes a sense amplifier 290, which may be a portion of a sense component 150 described with reference to FIG. 1. Circuit 200 may also include a word line 205, a digit line 210, and a plate line 215, which, in some examples, may correspond to a first access line 120, a second access line 130, and a third access line 140, respectively (e.g., of a memory section 110), as described with reference to FIG. 1. In some examples, the plate line 215 may be illustrative of a common plate line, a common plate, or another common node for the memory cell 105-a and another memory cell 105 (not shown) of a same memory section 110. The circuit 200 may also include a reference line 265 used by the sense amplifier 290 to determine a stored logic state of the memory cell 105-a.

As illustrated in FIG. 2, the sense amplifier 290 may include a first node 291 and a second node 292 which, in some examples, may be coupled with different access lines of a circuit (e.g., a signal line 260 and a reference line 265 of the circuit 200, respectively) or, in other examples, may be coupled with a common access line of a different circuit (not shown). In some examples, the first node 291 may be referred to as a signal node, and the second node 292 may be referred to as a reference node. However, other configurations of access lines or reference lines may be used to support the techniques described herein.

The memory cell 105-a may include a logic storage component (e.g., a memory element, a storage element, a memory storage element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The orientation of cell plate 221 and cell bottom 222 may be different (e.g., flipped) without changing the operation of the memory cell 105-a. The cell plate 221 may be accessed via the plate line 215 and cell bottom 222 may be accessed via the digit line 210. As described herein, various logic states may be stored by charging, discharging, or polarizing the capacitor 220.

The capacitor 220 may be electrically connected to the digit line 210, and the stored logic state of the capacitor 220 may be read or sensed by operating various elements represented in circuit 200. For example, the memory cell 105-a may also include a cell selection component 230 which, in some examples, may be referred to as a switching component or a selector device coupled with or between an access line (e.g., the digit line 210) and the capacitor 220. In some examples, a cell selection component 230 may be considered to be outside the illustrative boundary of the memory cell 105-a, and the cell selection component 230 may be referred to as a switching component or selector device coupled with or between an access line (e.g., the digit line 210) and the memory cell 105-a.

The capacitor 220 may be selectively coupled with the digit line 210 when the cell selection component 230 is activated (e.g., by way of an activating logical signal), and the capacitor 220 can be selectively isolated from the digit line 210 when the cell selection component 230 is deactivated (e.g., by way of a deactivating logical signal). A logical signal or other selection signal or voltage may be applied to a control node 235 (e.g., a control node, a control terminal, a selection node, a selection terminal) of the cell selection component 230 (e.g., via the word line 205, a selection line). In other words, the cell selection component 230 may be configured to selectively couple or decouple the capacitor 220 and the digit line 210 based on a logical signal or voltage applied via the word line 205 to the control node 235.

Activating the cell selection component 230 may be referred to as selecting or activating the memory cell 105-a, and deactivating the cell selection component 230 may be referred to as deselecting or deactivating the memory cell 105-a. In some examples, the cell selection component 230 is a transistor and its operation may be controlled by applying an activation voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor. The word line 205 may be used to activate the cell selection component 230. For example, a selection voltage applied to the word line 205 (e.g., a word line logical signal or a word line voltage) may be applied to the gate of a transistor of cell selection component 230, which may selectively connect the capacitor 220 with the digit line 210 (e.g., providing a conductive path between the capacitor 220 and the digit line 210). In some examples, activating the cell selection component 230 may be referred to as selectively coupling the memory cell 105-a with the digit line 210.

In other examples, the positions of the cell selection component 230 and the capacitor 220 in the memory cell 105-a may be switched, such that cell selection component 230 may be coupled with or between the plate line 215 and the cell plate 221, and the capacitor 220 may be coupled with or between the digit line 210 and the other terminal of the cell selection component 230. In such an embodiment, the cell selection component 230 may remain in electronic communication with the digit line 210 through the capacitor 220. This configuration may be associated with alternative timing and biasing for access operations.

In examples that employ a ferroelectric capacitor 220, the capacitor 220 may or may not fully discharge upon connection to the digit line 210. In various schemes, to sense the logic state stored by a ferroelectric capacitor 220, a voltage may be applied to the plate line 215 or the digit line 210, and the word line 205 may be biased (e.g., by activating the word line 205) to select the memory cell 105-a. In some cases, the plate line 215 or the digit line 210 may be virtually grounded and then isolated from the virtual ground, which may be referred to as a floating condition, an idle condition, or a standby condition, prior to activating the word line 205.

Operation of the memory cell 105-a by varying the voltage to cell plate 221 (e.g., via the plate line 215) may be referred to as "moving the cell plate." Biasing the plate line 215 or the digit line 210 may result in a voltage difference (e.g., the voltage of the digit line 210 minus the voltage of the plate line 215) across the capacitor 220. The voltage difference may accompany a change in the stored charge on capacitor 220 (e.g., due to charge sharing between the capacitor 220 and the digit line 210, due to charge sharing between the capacitor 220 and the plate line 215), where the magnitude of the change in stored charge may depend on the initial state of the capacitor 220 (e.g., whether the initial charge or logic state stored a logic 1 or a logic 0). In some schemes, the change in the stored charge of the capacitor 220 may cause a change in the voltage of one or both of the digit line 210 or the signal line 260, which may be used by the sense amplifier 290 to determine the stored logic state of the memory cell 105-a.

The digit line 210 may be coupled with additional memory cells 105 (not shown), and the digit line 210 may have properties that result in a non-negligible intrinsic capacitance 240 (e.g., on the order of picofarads (pF)), which may couple the digit line 210 with a voltage source 250-a. The voltage source 250-a may represent a common ground or virtual ground voltage, or the voltage of an adjacent access line of the circuit 200 (not shown). Although illustrated as a separate element in FIG. 2, the intrinsic capacitance 240 may be associated with properties distributed throughout the digit line 210.

In some examples, the intrinsic capacitance 240 may depend on physical characteristics of the digit line 210, including conductor dimensions (e.g., length, width, thickness) of the digit line 210. The intrinsic capacitance 240 may also depend on characteristics of adjacent access lines or circuit components, proximity to such adjacent access lines or circuit components, or insulation characteristics between the digit line 210 and such access lines or circuit components. Thus, a change in voltage of digit line 210 after selecting the memory cell 105-a may depend on the net capacitance of (e.g., associated with) the digit line 210. In other words, as charge flows along the digit line 210 (e.g., to the digit line 210, from the digit line 210), some finite charge may be stored along the digit line 210 (e.g., in the intrinsic capacitance 240, other capacitors or capacitance coupled with the digit line 210), and the resulting voltage of the digit line 210 may depend on the net capacitance of the digit line 210.

The resulting voltage of the digit line 210 or the signal line 260 after selecting the memory cell 105-a may be compared to a reference (e.g., a voltage of the reference line 265) by the sense amplifier 290 to determine the logic state that was stored in the memory cell 105-a. In some examples, a voltage of the reference line 265 may be provided by a reference component 285. In other examples, the reference component 285 may be omitted and a reference voltage may be provided, for example, by accessing the memory cell 105-a to generate the reference voltage (e.g., in a self-referencing access operation). Other operations may be used to support selecting or sensing the memory cell 105-a.

In some examples, the circuit 200 may include a signal development component 280, which may be an example of a signal development circuit coupled with or between the memory cell 105-a and the sense amplifier 290. The signal development component 280 may amplify or otherwise convert signals of the digit line 210 prior to a sensing operation. The signal development component 280 may include, for example, a transistor, an amplifier, a cascode, or any other charge or voltage converter or amplifier component. In some examples, the signal development component 280 may include a charge transfer sensing amplifier (CTSA), which may include one or more transistors in a cascode or voltage control configuration. In some examples with a signal development component 280, a line between the sense amplifier 290 and the signal development component 280 may be referred to as a signal line (e.g., signal line 260). In some examples (e.g., examples with or without a signal development component 280), the digit line 210 may be electrically connected directly with the sense amplifier 290.

In some examples, the circuit 200 may include a bypass line 270 that may permit selectively bypassing the signal development component 280 or some other signal generation circuit between the memory cell 105-a and the sense amplifier 290. In some examples, the bypass line 270 may be selectively enabled by way of a switching component 275. In other words, when the switching component 275 is activated, the digit line 210 may be coupled with the signal line 260 via the bypass line 270 (e.g., coupling the memory cell 105-a with the sense amplifier 290).

In some examples, when the switching component 275 is activated, the signal development component 280 may be selectively isolated from one or both of the digit line 210 or the signal line 260 (e.g., by another switching component or selection component, not shown). When the switching component 275 is deactivated, the digit line 210 may be selectively coupled with the signal line 260 via the signal development component 280. In other examples, a selection component may be used to selectively couple the memory cell 105-a (e.g., the digit line 210) with one of the signal development component 280 or the bypass line 270. Additionally or alternatively, in some examples, a selection component may be used to selectively couple the sense amplifier 290 with one of the signal development component 280 or the bypass line 270. In some examples, a selectable bypass line 270 may support generating a sense signal for detecting a logic state of the memory cell 105-a by using the signal development component 280, and generating a write signal to write a logic state to the memory cell 105-a that bypasses the signal development component 280.

Some examples of a memory device 100 that supports the techniques disclosed herein may include a circuit 200 that shares a common access line (not shown) between a memory cell 105 and a sense amplifier 290 to support generating a sense signal and a reference signal from the same memory cell 105. In one example, a common access line between a signal development component 280 and a sense amplifier 290 may take the place of the signal line 260 and the reference line 265 illustrated in circuit 200. In such examples the common access line may be connected to the sense amplifier 290 at two different nodes (e.g., a first node 291 and a second node 292, as described herein). In some examples, a common access line may permit a self-referencing read operation to share, in both a signal generating operation and a reference generating operation, components that may exist between the sense amplifier 290 and a memory cell 105 being accessed. Such a configuration may reduce the sensitivity of the sense amplifier 290 to operational variations of various components in a memory device 100, such as memory cells 105, access lines (e.g., a word line 205, a digit line 210, a plate line 215), signal development circuits (e.g., signal development component 280), transistors, voltage sources 250, and others.

Although the digit line 210 and the signal line 260 are identified as separate lines, the digit line 210, the signal line 260, and any other lines connecting a memory cell 105 with a sense component 150 may be referred to as a single access line. Constituent portions of such an access line may be identified separately for the purposes of illustrating intervening components and intervening signals in various example configurations.

The sense amplifier 290 may include various transistors or amplifiers to detect, convert, or amplify a difference in signals, which may be referred to as latching. For example, the sense amplifier 290 may include circuit elements that receive and compare a sense signal voltage (e.g., $V_{sig}$) at the first node 291 with a reference signal voltage (e.g., $V_{ref}$) at the second node 292. An output of the sense amplifier may be driven to a higher voltage (e.g., a positive voltage) or a lower voltage (e.g., a negative voltage, a ground voltage) based on the comparison at the sense amplifier 290.

For example, if the first node 291 has a lower voltage than the second node 292, the output of the sense amplifier 290 may be driven to a relatively lower voltage of a first sense amplifier voltage source 250-b (e.g., a voltage of $V_L$, which may be a ground voltage substantially equal to $V_0$ or a negative voltage). A sense component 150 that includes the sense amplifier 290 may latch the output of the sense amplifier 290 to determine the logic state stored in the memory cell 105-a (e.g., detecting a logic 0 when the first node 291 has a lower voltage than the second node 292).

If the first node 291 has a higher voltage than the second node 292, the output of the sense amplifier 290 may be driven to the voltage of a second sense amplifier voltage source 250-c (e.g., a voltage of $V_H$). A sense component 150 that includes the sense amplifier 290 may latch the output of the sense amplifier 290 to determine the logic state stored in the memory cell 105-a (e.g., detecting a logic 1 when the first node 291 has a higher voltage than the second node 292). The latched output of the sense amplifier 290, corresponding to the detected logic state of memory cell 105-a, may then be output via one or more input/output (I/O) lines (e.g., I/O line 295), which may include an output through a column component 135 or an input/output component 160 described with reference to FIG. 1.

To perform a write operation on the memory cell 105-a, a voltage may be applied across the capacitor 220. Various methods may be used. In one example, the cell selection component 230 may be activated through the word line 205 (e.g., by activating the word line 205) to electrically connect the capacitor 220 to the digit line 210. A voltage may be applied across capacitor 220 by controlling the voltage of the cell plate 221 (e.g., through the plate line 215) and the cell bottom 222 (e.g., through the digit line 210).

For example, to write a logic 0, the cell plate 221 may be taken high (e.g., applying a positive voltage to the plate line 215), and the cell bottom 222 may be taken low (e.g., grounding the digit line 210, virtually grounding the digit line 210, applying a negative voltage to the digit line 210). The opposite process may be performed to write a logic 1, where the cell plate 221 is taken low and the cell bottom 222 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the sense amplifier 290 may be used to perform the write operations, which may include coupling the first sense amplifier voltage source 250-b or the second sense component voltage source 250-c with the digit line. When the sense amplifier 290 is used to perform the write operations, the signal development component 280 may or may not be bypassed (e.g., by applying a write signal via the bypass line 270).

The circuit 200, including the sense amplifier 290, the cell selection component 230, the signal development component 280, or the reference component 285, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In some examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying source and drain voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable a conductivity by applying a relatively high logical signal voltage (e.g., a voltage corresponding to a logical "0" state, which may be associated with a ground or virtual ground voltage). In some examples where a p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In some examples, the transistor(s) may be formed on a substrate that is dedicated to a particular component of the circuit 200 (e.g., a substrate for the sense amplifier 290, a substrate for the signal development component 280, a substrate for the memory cell 105-a), or the transistor(s) may be formed on a substrate that is common for particular components of the circuit 200 (e.g., a substrate that is common for the sense amplifier 290, the signal development component 280, and the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

Although the circuit 200 illustrates a set of components relative to a single memory cell, various components of the circuit 200 may be duplicated in a memory device 100 to support various operations. For example, to support row access or "page" access operations, a memory device 100 may be configured with multiples of one or more of the sense amplifier 290, the signal line 260, the signal development component 280, the digit line 210, or other components, where the multiples may be configured according to a quantity of memory cells 105 that may be accessed in a row access or "page" access operation (e.g., in a simultaneous operation). In various examples, a set of such multiples may correspond to or otherwise be repeated for each memory section 110 in a memory device 100, or such a set of multiples may be shared among one or more memory sections 110 in a memory device.

In one illustrative example, for a memory device 100 that supports a 256-cell row access (e.g., a common accessing of 256 columns) or a 256-bit page, the memory device 100 (e.g., a sense component 150) may include at least one set of 256 sense amplifiers 290, 256 signal lines 260, 256 signal development components 280, and 256 digit lines 210, where, in some examples, a set of 256 memory cells 105 in a memory section 110 may be accessed by activating a single, common word line 205. In some examples, such a repetition may correspond to a single memory section 110, or may correspond to more than one memory section 110. However, various other configurations and combinations of components may be used for row access or page access operations, or other operations where multiple memory cells 105 are accessed simultaneously, that support the techniques described herein.

In some examples, charge may leak from one portion of the circuit 200 to another due to manufacturing defects, component breakdown, changes in composition, or other causes. In one example, charge leakage may follow a path "A" from the digit line 210 to the plate line 215, which may illustrate a charge leakage across a dielectric portion of the capacitor 220 or a charge leakage that otherwise flows around a dielectric portion of the capacitor 220 or through the capacitor 220. In some examples, the leakage that follows path "A" may be driven by a voltage difference between the digit line 210 and the plate line 215. In another example, leakage may follow a path "B" from the digit line 210 to the voltage source 250-a, which may illustrate a charge leakage from the digit line 210 to a ground voltage source or reference voltage or component (e.g., a chassis leakage). Other examples, not illustrated, may include other leakage paths that permit charge transfer between the memory cell 105-a and another component of a memory device 100 that includes the circuit 200, between the digit line 210 and another component of a memory device 100 that includes the circuit 200 (e.g., between the digit line 210 and another digit line 210, not shown), or the signal line 260 and another component of a memory device 100 that includes the circuit 200 (e.g., between the signal line 260 and another signal line 260, not shown), or various combinations thereof.

To detect charge leakage, the circuit 200 may include one or more leakage detection components 201, such as one or both of a leakage detection component 201-a connected with the digit line 210, or a leakage detection component 201-b connected with the signal line 260. A leakage detection component 201 may be configured to detect charge leakage in the circuit 200, such as a leakage or other transfer of charge that is above or otherwise satisfies a threshold (e.g., above a threshold that would indicate normal operation of the circuit 200, an amount of charge leakage that indicates abnormal operation of one or more elements of the circuit 200). Although the leakage detection components 201 are illustrated as being separate components, in some examples, a leakage detection component 201 may be included in a signal development component 280, or included in a sense amplifier 290, and a leakage detection component 201 may be connected with multiple access lines, or connected in series with an access line.

In some examples, a leakage detection component 201 may be configured to detect a charge leakage by identifying a change in voltage, or comparing a voltage to a reference voltage or threshold (e.g., using a sense amplifier, a multi-level cell (MLC) latch, a comparator, or other component of the leakage detection component 201). For example, the leakage detection component 201-a may be configured to monitor a voltage of the digit line 210, or the leakage detection component 201-b may be configured to monitor a voltage of the signal line 260.

In some examples, a leakage detection component 201 may be configured to detect a flow of charge (e.g., under scenarios or conditions where such a flow of charge, or a flow of charge above a threshold, would indicate leakage rather than charge transfer normally associated with an access operation). For example, the leakage detection component 201-a may be configured to detect a flow of charge along the digit line 210, or the leakage detection component 201-b may be configured to detect a flow of charge along the signal line 260, either of which may correspond to a flow of charge across the signal development component 280. In some examples, detecting a flow of charge may be supported by monitoring a voltage across a shunt resistor configured to convey the flow of charge (e.g., when a leakage detection component 201 is connected in series with an access line or component).

In some examples, charge leakage that follows path "A" may be associated with the cell selection component 230 being activated, and a leakage detection component 201 may be able to distinguish charge leakage that follows path "A" from other charge leakage (e.g., charge leakage that follows path "B") based on whether the cell selection component 230 is activated during a charge leakage detection operation. In other words, a leakage detection component 201 may be configured to detect cell-specific charge leakage (e.g., charge leakage that follows path "A", which may be specific to the memory cell 105-a), which may be distinguishable from other charge leakage that may be common to a set of memory cells 105 that share the digit line 210 (e.g., digit line leakage). In other examples, a leakage detection component 201 may not be configured to distinguish cell-specific charge leakage from other charge leakage associated more generally with an access line (e.g., charge leakage associated with the digit line 210, charge leakage associated with the signal line 260, charge leakage that is common to one or more of a set of memory cells 105).

In some examples, a leakage detection component 201 may be configured to perform a leakage detection operation during, or otherwise based at least in part on an access operation (e.g., of the memory cell 105-a), which may include performing a leakage detection operation while the memory cell 105-a is selected (e.g., while the cell selection component 230 is activated, while the word line 205 is activated). A leakage detection component 201 may thus be in communication with a memory controller 170, a sense component 150, the sense amplifier 290, or the word line 205, which may support the leakage detection component 201 performing operations during particular portions of an access operation. The leakage detection component 201 may also support providing information to support selectively performing either a direct write operation or a complementary write operation, which may include providing an indication of whether leakage was detected to one or more of a memory controller 170, a sense component 150, the sense amplifier 290, or other components. In various examples, a determination of whether to perform direct or complementary write operations may be based on a detection of cell-specific charge leakage (e.g., charge leakage that follows path "A", charge leakage associated with the memory cell 105-a, charge leakage associated with the capacitor 220), charge leakage associated with a particular access line (e.g., charge leakage that follows the path "B", charge leakage associated with the digit line 210 or signal line 260), or other detected charge leakage, or combinations thereof.

In some examples, a leakage detection component 201 may include a storage element (e.g., a temporary storage element, a latch, a capacitor, a storage element) that stores an indication of whether leakage was detected (e.g., during an access operation). In some examples, a stored indication may be maintained or otherwise valid for a most-recent access operation, and may be cleared or reset in response to another access being performed. A stored indication of whether leakage was detected may be received or requested by a memory controller 170, and a memory controller 170 or some other portion of a memory device 100 may subsequently store an indication of which type of write operation was performed, such as a bit flip indication (e.g., for one or more memory cells 105, for a row of memory cells 105, for a page of memory cells 105, for a set of memory cells 105 that share the word line 205). A bit flip indication may be used in a subsequent read operation to determine how to interpret a sensed logic state (e.g., interpreting a sensed logic state directly or as its complement). For example, depending on the status of a bit flip indication, an output on the I/O line 295 may be provided directly (e.g., indicating the logic state stored by the memory cell 105-a) or an output on the I/O line 295 may be inverted (e.g., indicating the complement of the logic state stored by the memory cell 105-a).

Figure 3A:
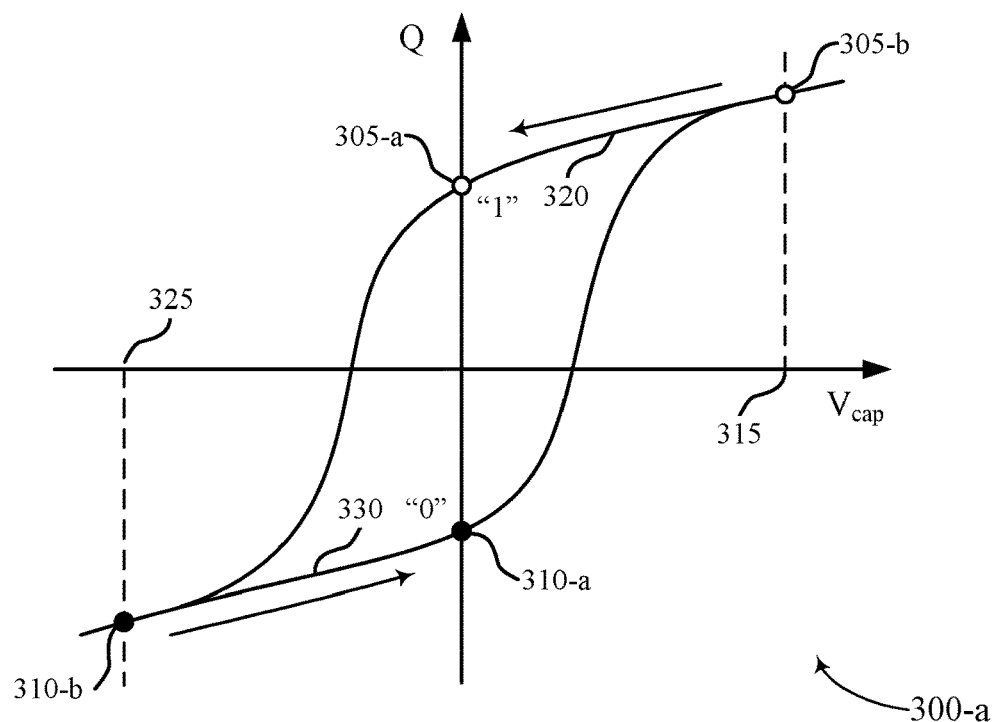
FIGS. 3A and 3B illustrate examples of non-linear electrical properties of a ferroelectric memory cell with hysteresis plots in accordance with various examples as disclosed herein.
Figure 3B:
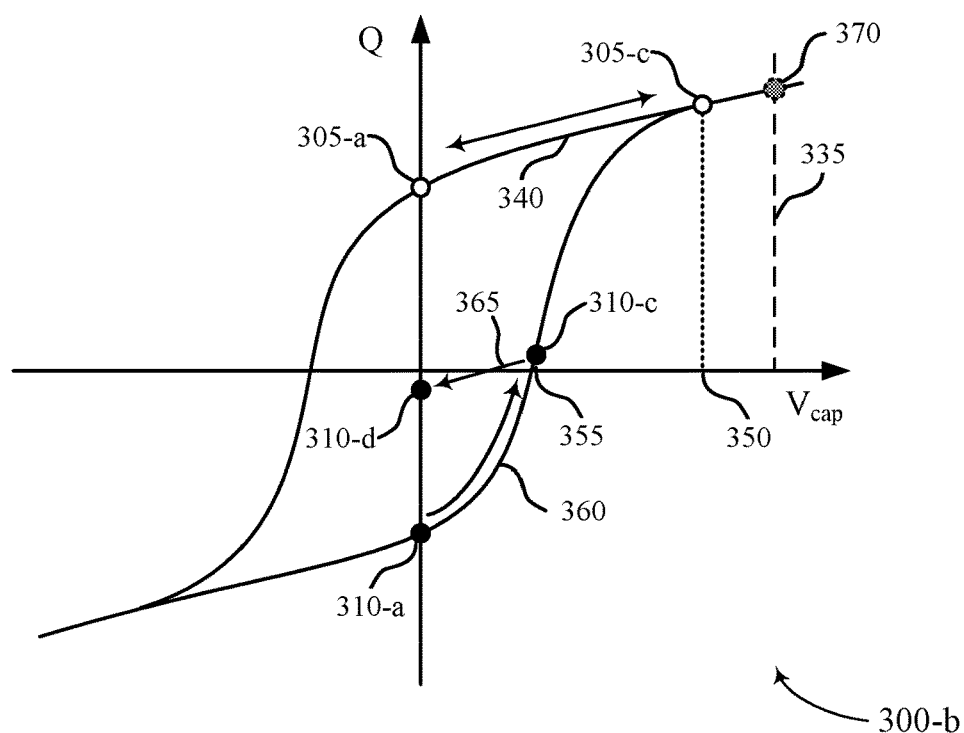

FIGS. 3A and 3B illustrate examples of non-linear electrical properties of a ferroelectric memory cell with hysteresis plots 300-a and 300-b in accordance with various examples as disclosed herein. The hysteresis plots 300-a and 300-b may illustrate examples of a writing process and a reading process, respectively, for a memory cell 105 employing a ferroelectric capacitor 220 as described with reference to FIG. 2. The hysteresis plots 300-a and 300-b depict the charge, Q, stored on the ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a digit line side of the capacitor 220 and a plate line side of the capacitor 220 (e.g., $V_{bottom} - V_{plate}$).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge may be stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in some DRAM arrays. Employing ferroelectric materials may reduce a need to perform refresh operations for some DRAM architectures, such that maintaining logic states of an FeRAM architecture may be associated with lower power consumption than maintaining logic states of a DRAM architecture.

The hysteresis plots 300-a and 300-b may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220. Additionally, it should be understood that the voltages in the hysteresis plots 300-a and 300-b represent a voltage difference across the capacitor (e.g., an electric potential between the terminals of the ferroelectric capacitor 220) and are directional. For example, a positive voltage may be realized by applying a positive voltage to the perspective terminal (e.g., a cell bottom 222) and maintaining the reference terminal (e.g., a cell plate 221) at ground or virtual ground (or approximately zero volts (0V)). In some examples, a negative voltage may be applied by maintaining the perspective terminal at ground and applying a positive voltage to the reference terminal (e.g., cell plate 221). In other words, positive voltages may be applied to arrive at a negative voltage difference $V_{cap}$ across the ferroelectric capacitor 220 and thereby negatively polarize the terminal in question. Similarly, two positive voltages, two negative voltages, or any combination of positive and negative voltages may be applied to the appropriate capacitor terminals to generate the voltage difference $V_{cap}$ shown in the hysteresis plots 300-a and 300-b.

As depicted in the hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, a charge state 305-a and a charge state 310-b, which may represent a negatively saturated polarization state and a positively saturated polarization state, respectively. The charge states 305-a and 310-a may be at a physical condition illustrating remnant polarization (Pr) values, which may refer to the polarization (or charge) that remains upon removing the external bias (e.g., voltage). According to the example of the hysteresis plot 300-a, the charge state 305-a may represent a logic 1 when no voltage difference is applied across the ferroelectric capacitor 220, and the charge state 310-a may represent a logic 0 when no voltage difference is applied across the ferroelectric capacitor 220. In some examples, the logic values of the respective charge states or polarization states may be reversed or interpreted in an opposite manner to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-b is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-b and the charge state 305-a at zero voltage across the capacitor. In other words, charge state 305-a may represent a logic 1 state at an equalized voltage across a ferroelectric capacitor 220 that has been positively saturated.

Similarly, voltage 325 may be a voltage equal to or lesser than a negative saturation voltage, and applying the voltage 325 across the ferroelectric capacitor 220 may result in charge accumulation until the charge state 310-b is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-b and the charge state 310-a at zero voltage across the capacitor. In other words, charge state 310-a may represent a logic 0 state at an equalized voltage across a ferroelectric capacitor 220 that has been negatively saturated. In some examples, the voltage 315 and the voltage 325, representing saturation voltages, may have the same magnitude, but opposite polarity across the ferroelectric capacitor 220.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-a, or the charge state 310-a, or some other charge state was initially stored, among other factors.

The hysteresis plot 300-b illustrates an example of access operations for reading stored charge states 305-a and 310-a. A read voltage 335 may be applied, for example, as a voltage difference via a digit line 210 and a plate line 215 as described with reference to FIG. 2. The hysteresis plot 300-b may illustrate read operations where the read voltage 335 is positive voltage difference $V_{cap}$ (e.g., where $V_{bottom} - V_{plate}$ is positive). A positive read voltage across the ferroelectric capacitor 220 may be referred to as a "plate low" read operation, where a digit line 210 is taken initially to a high voltage, and a plate line 215 is initially at a low voltage (e.g., a ground voltage). Although the read voltage 335 is shown as a positive voltage across the ferroelectric capacitor 220, in alternative access operations a read voltage may be a negative voltage across the ferroelectric capacitor 220, which may be referred to as a "plate high" read operation.

The read voltage 335 may be applied across the ferroelectric capacitor 220 while a memory cell 105 is selected (e.g., by activating a cell selection component 230 via a word line 205 as described with reference to FIG. 2). Upon applying the read voltage 335 to the ferroelectric capacitor 220, charge may flow into or out of the ferroelectric capacitor 220 via the associated digit line 210 and plate line 215, and, in some examples, different charge states or access line voltages may result depending on whether the ferroelectric capacitor 220 was at the charge state 305-*a* (e.g., a logic 1) or at the charge state 310-*a* (e.g., a logic 0), or some other charge state.

When performing a read operation on a ferroelectric capacitor 220 at the charge state 305-*a* (e.g., a logic 1), additional positive charge may accumulate across the ferroelectric capacitor 220, and the charge state may follow path 340 until reaching the charge and voltage of the charge state 305-*c*. The amount of charge flowing through the capacitor 220 may be related to the intrinsic or other capacitance of the digit line 210 (e.g., intrinsic capacitance 240 described with reference to FIG. 2), or other access line (e.g., signal line 260). In a "plate low" read configuration, a read operation associated with the charge states 305-*a* and 305-*c*, or more generally a read operation associated with the logic 1 state, may be associated with a relatively small amount of charge transfer (e.g., compared to a read operation associated with the charge states 310-*a* and 310-*c*, or more generally the logic 0 state).

As shown by the transition between the charge state 305-*a* and the charge state 305-*c*, the resulting voltage 350 across the ferroelectric capacitor 220 may be a relatively large positive value due to the relatively large change in voltage at the capacitor 220 for the given change in charge. Thus, upon reading a logic 1 in a "plate low" read operation, the digit line voltage, equal to the sum of $V_{PL}$ and $V_{cap}$ (e.g., $V_{bottom}-V_{plate}$) at the charge state 310-*c*, may be a relatively high voltage. Such a read operation may not change the remnant polarization of the ferroelectric capacitor 220 that stored the charge state 305-*a*, and thus after performing the read operation the ferroelectric capacitor 220 may return to the charge state 305-*a* via path 340 when the read voltage 335 is removed (e.g., by applying a zero net voltage across the ferroelectric capacitor 220, by equalizing the voltage across the ferroelectric capacitor 220). Thus, performing a read operation with a positive read voltage on a ferroelectric capacitor 220 with a charge state 305-*a* may be considered a non-destructive read process.

When performing the read operation on the ferroelectric capacitor 220 at the charge state 310-*a* (e.g., a logic 0), the stored charge may reverse polarity as a net positive charge accumulates across the ferroelectric capacitor 220, and the charge state may follow the path 360 until reaching the charge and voltage of the charge state 310-*c*. The amount of charge flowing through the ferroelectric capacitor 220 may again be related to the intrinsic or other capacitance of the digit line 210 (e.g., intrinsic capacitance 240 described with reference to FIG. 2). In a "plate low" read configuration, a read operation associated with the charge states 310-*a* and 310-*c*, or more generally a read operation associated with the logic 0 state, may be associated with a relatively large amount of charge transfer (e.g., compared to a read operation associated with the charge states 305-*a* and 305-*c*, or more generally the logic 1 state).

As shown by the transition between the charge state 310-*a* and the charge state 310-*c*, the resulting voltage 355 may, in some cases, be a relatively small positive value due to the relatively small change in voltage at the capacitor 220 for the given change in charge. Thus, upon reading a logic 0 in a "plate low" read operation, the digit line voltage, equal to the sum of $V_{PL}$ and $V_{cap}$ (e.g., $V_{bottom}-V_{plate}$) at the charge state 310-*c*, may be a relatively low voltage.

The transition from the charge state 310-*a* to the charge state 310-*d* may be illustrative of a sensing operation that is associated with a partial reduction or partial reversal in polarization or charge of a ferroelectric capacitor 220 of a memory cell 105 (e.g., a reduction in the magnitude of charge Q from the charge state 310-*a* to the charge state 310-*d*). In other words, according to the properties of the ferroelectric material, after performing the read operation the ferroelectric capacitor 220 may not return to the charge state 310-*a* when the read voltage 335 is removed (e.g., by applying a zero net voltage across the ferroelectric capacitor 220, by equalizing the voltage across the ferroelectric capacitor 220). Rather, when applying a zero net voltage across the ferroelectric capacitor 220 after a read operation of the charge state 310-*a* with read voltage 335, the charge state may follow path 365 from the charge state 310-*c* to the charge state 310-*d*, illustrating a net reduction in polarization magnitude (e.g., a less positively polarized charge state than initial charge state 310-*a*, illustrated by the difference in charge between the charge state 310-*a* and the charge state 310-*d*). Thus, performing a read operation with a positive read voltage on a ferroelectric capacitor 220 with a charge state 310-*a* may be described as a destructive read process. However, in some sensing schemes, a reduced remnant polarization may still be read as the same stored logic state as a saturated remnant polarization state (e.g., supporting detection of a logic 0 from both the charge state 310-*a* and the charge state 310-*d*), thereby providing a degree of non-volatility for a memory cell 105 with respect to read operations.

The position of the charge state 305-*c* and the charge state 310-*c* after initiating a read operation may depend on a number of factors, including the specific sensing scheme and circuitry. In some cases, the final charge may depend on the net capacitance of the digit line 210 coupled with the memory cell 105, which may include an intrinsic capacitance 240, integrator capacitors, and others. For example, if a ferroelectric capacitor 220 is electrically coupled with a plate line 215 at 0V and the read voltage 335 is applied to a digit line 210, the voltage of the digit line 210 may fall when the memory cell 105 is selected due to charge flowing from the net capacitance of the digit line 210 to the ferroelectric capacitor 220. Thus, in some examples, a voltage measured at a sense component 150 may not be equal to the read voltage 335, or the resulting voltages 350 or 355, and instead may depend on the voltage of the digit line 210 following a period of charge sharing.

The position of the charge state 305-*c* and the charge state 310-*c* on hysteresis plot 300-*b* upon initiating a read operation may depend on the net capacitance of a digit line 210 and may be determined through a load-line analysis. In other words, the charge states 305-*c* and 310-*c* may be defined with respect to the net capacitance of the digit line 210, or other access line (e.g., a signal line 260). As a result, the voltage of the ferroelectric capacitor 220 after initiating a read operation (e.g., voltage 350 when reading the ferroelectric capacitor 220 that stored the charge state 305-*a*, voltage 355 when reading the ferroelectric capacitor 220 that stored the charge state 310-*a*), may be different and may depend on the initial state of the ferroelectric capacitor 220. In some examples, the amount of change in polarization of a ferroelectric capacitor 220 of a memory cell 105 as a result of a sensing operation may be selected according to a particular sensing scheme. In some examples, sensing operations having a greater change in polarization of a ferroelectric capacitor 220 of a memory cell 105 may be associated with relatively greater robustness in detecting a logic state of a memory cell 105 (e.g., wider sense margins).

The initial state (e.g., charge state, logic state) of the ferroelectric capacitor 220 may be determined by comparing the voltage of a digit line 210 (or signal line 260, where applicable) resulting from the read operation with a reference voltage (e.g., via a reference line 265 as described with reference to FIG. 2, or via a common access line). In some examples, the digit line voltage may be the sum of the plate line voltage and the final voltage across the ferroelectric capacitor 220 (e.g., voltage 350 when reading the ferroelectric capacitor 220 having a stored charge state 305-a, or voltage 355 when reading the ferroelectric capacitor 220 having a stored charge state 310-a). In some examples, the digit line voltage may be the difference between the read voltage 335 and the final voltage across the capacitor 220 (e.g., (read voltage 335-voltage 350) when reading the ferroelectric capacitor 220 having a stored charge state 305-a, (read voltage 335-voltage 355) when reading the ferroelectric capacitor 220 having a stored charge state 310-a).

In some examples, read operations of a memory cell 105 may be associated with a fixed voltage of a digit line 210, where a charge state of a ferroelectric capacitor 220 after initiating a read operation may be the same regardless of its initial charge state. For example, in a read operation where a digit line 210 is held at a fixed read voltage 335, the ferroelectric capacitor 220 may proceed to a charge state 370 for both the case where the ferroelectric capacitor initially stored a charge state 305-a and the case where the ferroelectric capacitor initially stored a charge state 310-a. Accordingly, rather than using a difference in voltage of a digit line 210 to detect an initial charge state or logic state, in some examples, the initial charge state or logic state of the ferroelectric capacitor 220 may be determined based at least in part on the difference in charge associated with the read operation. For example, as illustrated by hysteresis plot 300-b, a logic 1 may be detected based on difference in charge, Q, between charge state 305-a and charge state 370 (e.g., a relatively small amount of charge transfer), and a logic 0 may be detected based on a difference in charge, Q, between charge state 310-a and charge state 370 (e.g., a relatively large amount of charge transfer).

In some examples, such a detection may be supported by a charge-transfer sensing amplifier, a cascode (e.g., a transistor configured in a cascode arrangement), or other signal development circuitry between a digit line 210 and a signal line 260, where a voltage of the signal line 260 may be based at least in part on the amount of charge transfer of a capacitor 220 after initiating a read operation (e.g., where the described charge transfer may correspond to an amount of charge that passes through the charge-transfer sensing amplifier, cascode, or other signal development circuitry). In such examples, the voltage of the signal line 260 may be compared with a reference voltage (e.g., at a sense amplifier 290) to determine the logic state initially stored by the ferroelectric capacitor 220, despite the digit line 210 being held at a fixed voltage level.

In some examples where a digit line 210 is held at a fixed read voltage 335, a capacitor 220 may be positively saturated after a read operation irrespective of whether the capacitor 220 was initially at a charge state 305-a (e.g., a logic 1) or initially at a charge state 310-a (e.g., a logic 0). Accordingly, after such a read operation, the capacitor 220 may, at least temporarily, be charged according to a logic 1 state irrespective of its initial or intended logic state. Thus, a rewrite operation may be required at least when the capacitor 220 is intended to store a logic 0 state, where such a rewrite operation may include applying a write voltage 325 to store a logic 0 state as described with reference to hysteresis plot 300-a. Such rewrite operations may be configured or otherwise described as a selective rewrite operation, since a rewrite voltage may not need to be applied when the capacitor 220 is intended to store a logic 1 state. In some examples, such an access scheme may be referred to as a "2Pr" scheme, where the difference in charge for distinguishing a logic 0 from a logic 1 may be equal to two times the remnant polarization of a memory cell 105 (e.g., a difference in charge between charge state 305-a, a positively saturated charge state, and charge state 310-a, a negatively saturated charge state).

In some sensing schemes, a reference voltage may be generated such that the reference voltage is between the possible voltages (e.g., of a digit line 210, of a signal line 260) that may result from reading different logic states. For example, a reference voltage may be selected to be lower than the resulting voltage of a digit line 210 or signal line 260 when reading a logic 1, and higher than the resulting voltage of the digit line 210 or signal line 260 when reading a logic 0. In other examples, a comparison may be made at a portion of a sense component 150 or sense amplifier 290 that is different from a portion where a digit line 210 or signal line 260 is coupled, and therefore a reference voltage may be selected to be lower than the resulting voltage at the comparison portion of the sense component 150 or sense amplifier 290 when reading a logic 1, and higher than the resulting voltage at the comparison portion of the sense component 150 or sense amplifier 290 when reading a logic 0. During comparison by the sense component 150 or sense amplifier 290, the voltage based on the sensing may be determined to be higher or lower than the reference voltage, and the stored logic state of the memory cell 105 (e.g., a logic 0, a logic 1) may thus be determined.

During a sensing operation, the resulting signals from reading various memory cells 105 may be a function of manufacturing or operational variations between the various memory cells 105. For example, capacitors 220 of various memory cells 105 may have different levels of capacitance or saturation polarization, so that a logic 1 may be associated with different levels of charge from one memory cell to the next, and a logic 0 may be associated with different levels of charge from one memory cell to the next. Further, intrinsic or other capacitance (e.g., intrinsic capacitance 240 described with reference to FIG. 2) may vary from one digit line 210 to another digit line 210 in a memory device, or from one signal line 260 to another signal line 260, and may also vary within a digit line 210 from the perspective of one memory cell 105 to the next memory cell 105 on the same digit line 210. Thus, for these and other reasons, reading a logic 1 may be associated with different levels of voltage of a digit line 210 or a signal line 260 from one memory cell 105 to the another (e.g., resulting voltage 350 may vary from reading one memory cell 105 to the next), and reading a logic 0 may be associated with different levels of voltage from one memory cell 105 to another (e.g., resulting voltage 355 may vary from reading one memory cell 105 to the next).

In some examples, a reference voltage may be provided between a statistical average of voltages associated with reading a logic 1 and a statistical average of voltages associated with reading a logic 0, but the reference voltage may be relatively closer to the resulting voltage of reading one of the logic states for any given memory cell 105. The minimum difference between a resulting voltage of reading a particular logic state (e.g., as a statistical value for reading a plurality of memory cells 105 of a memory device) and an associated level of a reference voltage may be referred to as a "minimum read voltage difference" or a "read margin," and having a low minimum read voltage difference or read margin may be associated with difficulties or sensitivities in reliably sensing the logic states of memory cells 105 in a given memory device 100.

In some memory devices 100, charge leakage (e.g., charge leakage above a threshold) may adversely affect the ability of a memory device 100 to determine a logic state stored by a memory cell 105. For example, for a read operation with a fixed read voltage 335 on a digit line 210 in accordance with hysteresis plot 300-b, when reading a memory cell 105 storing a logic 0, charge leakage may be superimposed on the difference in charge between charge state 310-a and charge state 370, and when reading a memory cell 105 storing a logic 1, charge leakage may be superimposed on the difference in charge between charge state 305-a and charge state 370. In some examples, the superimposed charge leakage may reduce margins for distinguishing a logic 0 from a logic 1 when reading a memory cell 105. For example, charge leakage of the memory cell 105, the digit line 210, or the signal line 260 may increase the likelihood that a voltage of a signal line 260 is on the same side of a reference voltage when reading both a logic 1 and a logic 0. In other words, such charge leakage may increase the likelihood that a memory cell 105 that was written with a logic 1 is incorrectly read as storing a logic 0.

In accordance with the present disclosure, a memory device 100 may identify a charge leakage associated with one or more memory cells 105 or access lines (e.g., digit lines 210, signal lines 260), and may determine whether to intentionally invert a logic state stored by a memory cell 105 so it is more likely to be read properly in the presence of charge leakage. For example, a memory device 100 may determine a logic state stored by a memory cell 105 during an access operation (e.g., a read portion of the access operation, a write portion of the access operation), and also detect whether the memory cell 105 or relevant access line is associated with a charge leakage (e.g., during a leakage detection portion of the access operation). In some cases, the memory device 100 may determine to write a complement of the detected logic state (e.g., a different logic state, an inverted logic state, an opposite logic state) to a given memory cell 105, or a set of memory cells 105 that include the given memory cell 105, based in part on detecting the charge leakage.

In some examples, determining to write the complement of the logic state may be based on the detected logic state being associated with a first amount of charge transfer (e.g., for a logic 1, a difference in charge between charge state 305-c and 305-a or a difference in charge between charge state 370 and 305-a, depending on the type of access operation or associated circuitry), and the complement of the logic state being associated with a second amount of charge transfer that is greater than the first amount of charge transfer (e.g., for a logic 0, a difference in charge between charge state 310-c and 310-a or a difference in charge between charge state 370 and 310-a, depending on the type of access operation or associated circuitry). For example, in accordance with the hysteresis plots 300-a and 300-b, based on identifying a memory cell 105 storing a logic 1 (e.g., according to a write operation or a read operation), and detecting a charge leakage associated with the memory cell 105 (e.g., a charge leakage of a digit line 210 or a signal line 260 connected to the memory cell 105, a charge leakage detected during the write operation or read operation), the associated memory device may determine to instead write the memory cell 105 with a logic 0 (e.g., a complement of the identified logic 1).

Accompanying the writing of a complementary logic state (e.g., a logic 0) to the memory cell 105, the memory device 100 may also store an indication that the complement of the detected logic state was written to at least the memory cell 105, such as a bit flip indication. In various examples, such a bit flip indication may correspond to a set of one or more memory cells 105 that include the memory cell 105 for which an associated charge leakage was detected (e.g., a single-cell indication, an indication corresponding to a plurality of memory cells 105, an indication corresponding to a row of memory cells 105, an indication corresponding to a page of memory cells 105, an indication corresponding to a set of memory cells 105 that share a word line 205). For example, a memory device 100 may store such an indication (e.g., at a memory controller 170, at a storage component of a memory device 100 that is accessible to a memory controller 170) to track whether a memory cell 105, or set of memory cells 105, has been programmed with a direct logic status or a complementary logic status (e.g., a flipped status). Such an indication may be used in a subsequent read operation to properly interpret the changed logic state of the one or more memory cells 105 of the set when reading information of the memory device 100 (e.g., determining, based on a bit flip indication, whether to directly interpret the logic state stored by a memory cell 105 or to invert or otherwise change the interpretation of the complementary logic state stored by the memory cell 105). Thus, detected charge leakage may be accounted for by changing a logic state stored by a memory cell 105 (e.g., during a rewrite operation), and tracking such a change for a subsequent read operation, which may avoid an incorrect interpretation of information stored by the memory cell 105 that may otherwise result from charge leakage.

Figure 4:
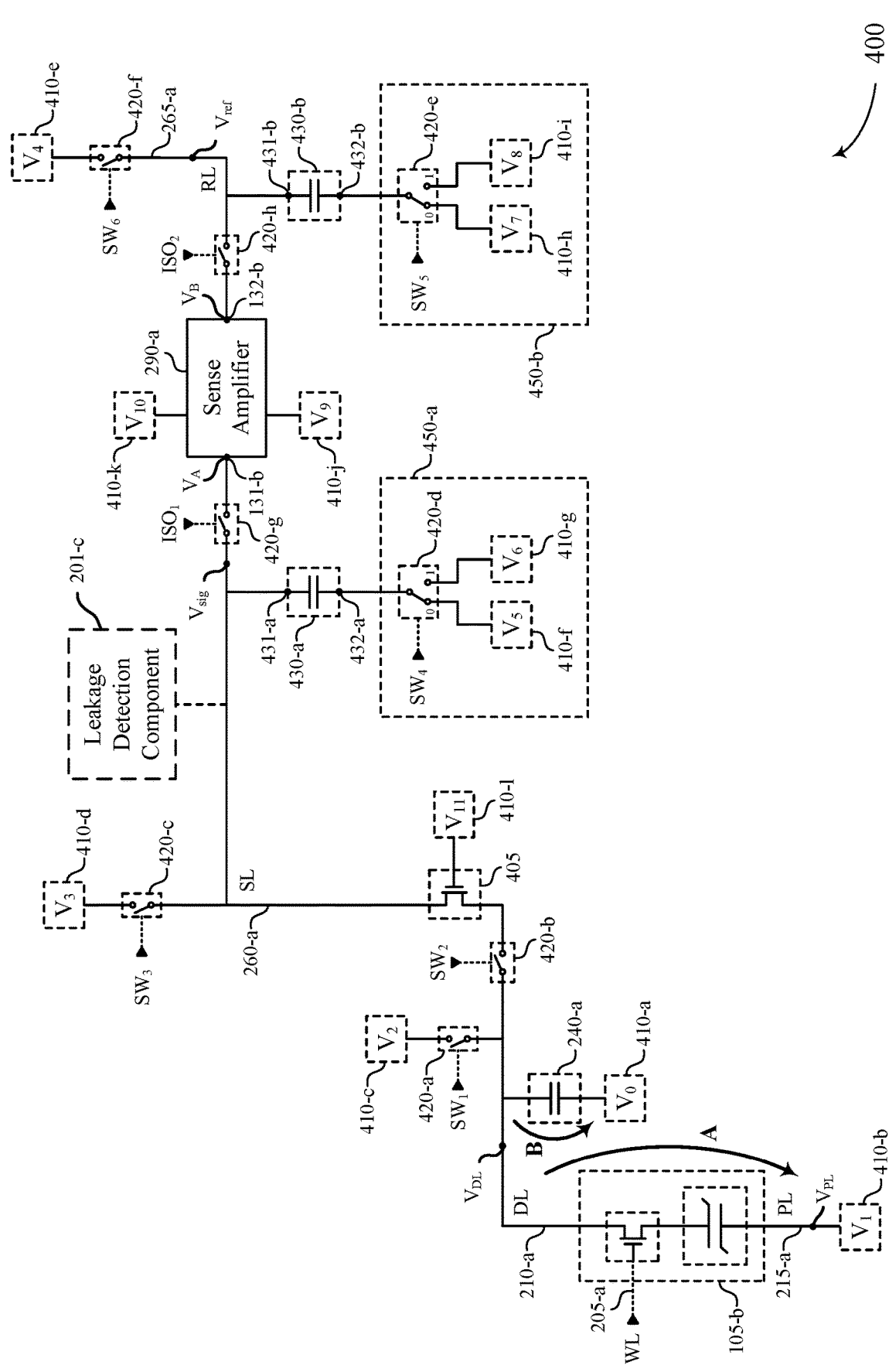
FIG. 4 illustrates an example of a circuit that supports memory management for charge leakage in accordance with examples as disclosed herein.

FIG. 4 illustrates an example of a circuit 400 that supports memory management for charge leakage in accordance with examples as disclosed herein. The circuit 400 includes a sense amplifier 290-a for sensing a logic state of a memory cell 105-b. Electrical charge or other signals may be communicated between the sense amplifier 290-a and the memory cell 105-b over a digit line 210-a and a signal line 260-a, which may, in combination, be referred to as a single access line of the memory cell 105-b. Signals of the access line may be illustrated by voltage $V_{DL}$ on the digit line 210-a, and $V_{sig}$ on the signal line 260-a, as shown.

The example circuit 400 may include an amplifier 405 coupled between the digit line 210-a and the signal line 260-a, which may be enabled by voltage source 410-l. In various examples, the amplifier 405 may be an example of a signal development component 280, or otherwise be included as part of a signal development component 280. The circuit 400 may also include a word line 205-a for selecting or deselecting the memory cell 105-b (e.g., by way of logic signal WL) and a reference line 265-a for providing a reference signal (e.g., $V_{ref}$, as shown) for comparison with a signal of the signal line 260-a when detecting a logic state of the memory cell 105-b. The circuit 400 may also include a plate line 215-a for accessing a cell plate of a capacitor of the memory cell 105-b. Thus, the memory cell 105-b may represent a memory cell 105 coupled between a first access line (e.g., the digit line 210-a and the signal line 260-a) and a second access line (e.g., the plate line 215-a).

The circuit 400 may include various voltage sources 410, which may be coupled with various voltage supplies or common grounding or virtual grounding points of a memory device that includes the example circuit 400.

A voltage source 410-a may represent a common grounding point (e.g., a chassis ground, a neutral point), which may be associated with a common reference voltage having a voltage $V_0$, from which other voltages are defined. The voltage source 410-a may be coupled with the digit line 210-a via the intrinsic capacitance 240-a of the digit line 210-a.

A voltage source 410-b having a voltage $V_1$ may represent a plate line voltage source, and may be coupled with the memory cell 105-b via a plate line 215-a of the memory cell 105-b. In some examples, the voltage source 410-b may be controlled for access operations such as read or write operations, including those operations described with reference to hysteresis plots 300-a and 300-b of FIG. 3. In other words, in some examples, the voltage source 410-b may be a variable voltage source, where a voltage $V_1$ may have multiple levels.

A voltage source 410-c having a voltage $V_2$ may represent a digit line voltage source, and may be coupled with the digit line 210-a via a switching component 420-a, which may be activated or deactivated by a logical signal $SW_1$.

A voltage source 410-d having a voltage $V_3$ may represent a signal line precharge voltage source, and may be coupled with the signal line 260-a via a switching component 420-c, which may be activated or deactivated by a logical signal $SW_3$.

A voltage source 410-e having a voltage $V_4$ may represent a reference signal voltage source, and may be coupled with the reference line 265-a via a switching component 420-f, which may be activated or deactivated by a logical signal $SW_6$.

A voltage source 410-l having a voltage $V_{11}$ may represent an amplifier or cascode voltage source, and may be coupled with the amplifier 405. In some examples, the amplifier 405 may be a transistor, and the voltage source 410-l may be coupled with the gate of the transistor. The amplifier 405 may be coupled with the signal line 260-a at a first terminal, and the digit line 210-a at a second terminal. The amplifier 405 may provide a conversion of charge, voltage, or other signals between the digit line 210-a and the signal line 260-a.

The amplifier 405 may permit a flow of charge (e.g., electrical charge, electrical current) from the signal line 260-a to the digit line 210-a, as fed or enabled by the voltage source 410-l, upon a reduction in voltage of the digit line 210-a (e.g., upon selection of the memory cell 105-b). In some examples, the described flow of charge across the amplifier 405 may correspond to a charge transfer associated with logic states of the memory cell 105-b, or a charge transfer otherwise associated with accessing the memory cell 105-b. For example, when the memory cell 105-b includes a ferroelectric capacitor as illustrated by the hysteresis plots 300-a and 300-b, and the amplifier 405 is configured to maintain the voltage of the digit line 210-a to a read voltage 335, a flow of charge across the amplifier 405 (e.g., during a read operation) may correspond to or be otherwise based at least in part on the difference in charge, Q, between charge states 370 and 305-a when the memory cell 105-b stored a logic 1, and a flow of charge across the amplifier 405 may correspond to or otherwise be based at least in part on the difference in charge, Q, between charge states 370 and 310-a when the memory cell 105-b stored a logic 0.

The circuit 400 may also include a first integrator capacitor 430-a and a second integrator capacitor 430-b, which may each be coupled with a respective variable voltage source 450. For example, the first integrator capacitor 430-a may be coupled with the signal line 260-a at a first terminal 431-a, and coupled with a variable voltage source 450-a at a second terminal 432-a. The second integrator capacitor 430-b may be coupled with the reference line 265-a at a first terminal 431-b, and coupled with a variable voltage source 450-b at a second terminal 432-b In some examples, a flow of charge across the amplifier 405 may be accompanied by a change in voltage of the signal line 260-a. For example, when the signal line 260-a is not otherwise coupled with a voltage source, a relatively small flow of charge to the digit line 210-a may be associated with a relatively small change in voltage of the signal line 260-a, whereas a relatively large flow of charge to the digit line 210-a may be associated with a relatively large change in voltage of the signal line 260-a. Changes in voltage of the signal line 260-a associated with an access operation may be based on the net capacitance of the signal line 260-a (e.g., including the integrator capacitor 430-a), where the signal line 260-a may undergo a relatively small change in voltage or a relatively large change in voltage depending on the flow of charge across the amplifier 405 after selecting the memory cell 105-b.

In various examples, the amplifier 405 may be referred to as a "voltage regulator" or a "bias component," relating to how the amplifier 405 regulates a flow of charge in response to the voltage or charge transfer of the digit line 210-a. In some examples, the amplifier 405, or combination of the amplifier 405 and the integrator capacitor 430-a, may be referred to as a charge transfer sensing amplifier. The amplifier 405 may be isolated from the digit line 210-a by a switching component 420-b, which may be activated or deactivated by a logical signal $SW_2$. In some examples, the switching component 420-b may be part of a column component 135, a multiplexer, or some other circuitry configured to selectively couple the digit line 210-a with the amplifier 405 or the signal line 260-a.

In the example of circuit 400, the variable voltage source 450-a may include a voltage source 410-f having a voltage $V_5$ and a voltage source 410-g having a voltage $V_6$, which may be selected for connection with the first integrator capacitor 430-a by a switching component 420-d by way of a logical signal $SW_4$. In some examples, the voltage source 410-f may be coupled with a common grounding point (not shown). In other examples the voltage source 410-f may be coupled with a voltage supply that provides a positive or negative voltage. Voltage source 410-g may be coupled with a voltage supply having a higher voltage than that of voltage source 410-f, which may provide a voltage boosting function in accordance with the difference in voltage between voltage source 410-g and 410-f, equal to $V_6-V_5$, or simply $V_6$ when the voltage source 410-f is grounded.

In the example of circuit 400, the variable voltage source 450-b may include a voltage source 410-h having a voltage $V_7$ and a voltage source 410-i having a voltage $V_8$, which may be selected for connection with the second integrator capacitor 430-b by a switching component 420-e by way of a logical signal $SW_5$. In some examples, the voltage source 410-h may be coupled with a common grounding point (not shown). In other examples the voltage source 410-h may be coupled with a voltage supply that provides a positive or negative voltage. Voltage source 410-i may be coupled with a voltage supply having a higher voltage than that of voltage source 410-h, which may provide a voltage boosting function in accordance with the difference in voltage between voltage source 410-i and 410-h, equal to $V_8-V_7$, or simply $V_8$ when the voltage source 410-h is grounded.

In various examples, one or more components of the circuit 400 may be included in or otherwise considered to be part of signal development circuitry, such as a signal development component 280 described with reference to FIG. 2. For example, any one or more of the voltage source 410-c, the switching component 420-a, the switching component 420-b, the amplifier 405, the voltage source 410-l, the voltage source 410-d, the switching component 420-c, the voltage source 450-a, or the integrator capacitor 430-a may be included in a signal development component 280, or otherwise be considered within the illustrative boundaries of such a signal development component 280.

Although circuit 400 is shown as including two variable voltage sources 450, some configurations in accordance with the present disclosure may include a single, common variable voltage source 450. For example, a first voltage source 410 of a common variable voltage source 450 may be coupled with both the second terminal 432-a of the first integrator capacitor 430-a and the second terminal 432-b of the second integrator capacitor 430-b when a switching component 420 of the common variable voltage source 450 is deactivated, and a second voltage source 410 of the common variable voltage source 450 may be coupled with both the second terminal 432-a of the first integrator capacitor 430-a and the second terminal 432-b of the second integrator capacitor 430-b when the switching component 420 of the common variable voltage source 450 is activated. In some examples that use a common variable voltage source 450, the source voltage provided to the second terminal 432-a of the first integrator capacitor 430-a may be different to the source voltage provided to the second terminal 432-b of the second integrator capacitor 430-b due to differences in the circuit (e.g., conductor length, width, resistance, capacitance) between the variable voltage source 450 and each of the integrator capacitors 430.

Further, although the variable voltage sources 450 are illustrated as including two voltage sources 410 and a switching component 420, a variable voltage source 450 supporting the operations herein may include other configurations, such as a voltage buffer that provides a variable voltage to one or both of the second terminal 432-a of the first integrator capacitor 430-a and the second terminal 432-b of the second integrator capacitor 430-b. In other examples, a variable voltage source 450 may be replaced with fixed voltage sources, or other types of voltage sources. Additionally or alternatively, the described operations of voltage boosting may be omitted from an access operation.

To support various operations described herein, the sense amplifier 290-a may be isolated from portions of the circuit 400. For example, the sense amplifier 290-a may be coupled with the signal line 260-a via a switching component 420-g (e.g., an isolation component), which may be activated or deactivated by a logical signal $ISO_1$. Additionally or alternatively, the sense amplifier 290-a may be coupled with the reference line 265-a via a switching component 420-h (e.g., an isolation component), which may be activated or deactivated by a logical signal $ISO_2$. Further, the sense amplifier 290-a may be coupled with a voltage source 410-j having a voltage $V_9$ and a voltage source 410-k having a voltage of $V_{10}$, which may be examples of sense amplifier voltage sources 250-b and 250-c, described with reference to FIG. 2, respectively.

Each of the logical signals illustrated in circuit 400 may be provided by a memory controller (not shown), such as a memory controller 170 described with reference to FIG. 1. In some examples, certain logical signals may be provided by other components. For example, logical signal WL may be provided by a row decoder (not shown), which may be included in a row component 125 described with reference to FIG. 1.

In various examples, voltage sources 410 may be coupled with different configurations of voltage supplies or common grounding or virtual grounding points of a memory device that includes the example circuit 400. For example, in some embodiments, voltage sources 410-a, 410-f, 410-h, or 410-j, or any combination thereof, may be coupled with the same ground point or virtual ground point, and may provide substantially the same reference voltage for various operations of accessing the memory cell 105-b. In some embodiments, several voltage sources 410 may be coupled with the same voltage supply of a memory device. For example, in some embodiments, voltage sources 410-c, 410-d, 410-g, 410-i, or 410-k, or any combination thereof, may be coupled with a voltage supply having a certain voltage (e.g., a voltage of 1.5V, which may be referred to as "VARY"). In such embodiments, the signal line 260-a may be boosted to a voltage substantially equal to 2*VARY, or approximately 3.0V, prior to selecting the memory cell 105-b via word line 205-a for sensing. In other examples, voltage sources 410-g and 410-i may be coupled with a different voltage supply than other voltage supplies (e.g., a voltage of 1.2V, which may be referred to as "PDS"), which may thus be associated with a voltage boost of 1.2V.

In some examples, the voltage sources 410-j and 410-k may be selected according to particular input/output parameters. For example, voltage sources 410-j and 410-k may be substantially at 0V and 1V, respectively, in accordance with certain input/output component conventions such as some DRAM conventions. Although voltage sources 410 may be coupled with common voltage supplies or grounding points, the voltage of each of the voltage sources 410 coupled with a common voltage supply or common grounding point may be different due to various differences in the circuit (e.g., conductor length, width, resistance, capacitance) between the respective voltage sources 410 and the associated common voltage supply or common grounding point.

Voltage source 410-e may provide a reference voltage for sensing the logic state of the memory cell 105-b. For example, a voltage of $V_4$ may be configured to be an average between signal line voltages associated with sensing a logic 1 and a logic 0. In some examples, a voltage of $V_4$ may be provided as a voltage dropped from a voltage supply of the memory device, which may be the same voltage supply coupled with other voltage sources 410. For example, $V_4$ may be provided by connecting voltage source 410-e with a same voltage supply as voltage source 410-d, but with an intervening electrical load (e.g., a resistive load or capacitance) between the voltage supply and the voltage source 410-e).

The circuit 400 may also include a leakage detection component 201-c, which may be configured to detect charge leakage associated with one or more of the memory cell 105-b, the digit line 210-a, the amplifier 405, or the signal line 260-a. For example, the leakage detection component 201-a may be configured to monitor a voltage of the signal line 260-a (e.g., $V_{sig}$), and detect a charge leakage by identifying a change in voltage of the signal line 260-a, or comparing a voltage to a reference voltage or threshold (e.g., using a sense amplifier, a multi-level cell (MLC) latch, a comparator). For example, the leakage detection component 201-c may be configured to identify a drop in voltage of the signal line 260-a during conditions where the voltage of the signal line 260-a should be, or is otherwise expected to be stable or above a threshold (e.g., after a signal on the digit line 210-a or signal line 260-a has been developed or should otherwise be stable). In some examples, identifying such a drop in voltage may indicate that charge is flowing across the amplifier 405 (e.g., as enabled by the voltage source 410-*l*) or out of the integrator capacitor 430-*a*, which may be responsive to the voltage of the digit line 210-*a* falling due to charge leakage along paths "A" or "B". Although illustrated as being a separate component, in some examples, the leakage detection component 201-*c* may be included in the sense amplifier 290-*a*.

In some examples, charge leakage may adversely affect the ability of the sense amplifier 290 to detect a logic state stored by the memory cell 105-*a*. Therefore, in accordance with the described techniques, a memory device that includes the circuit 400 may be configured to determine whether to store a direct logic state to the memory cell 105-*b*, or a complementary logic state to the memory cell 105-*a*, based on a detection of charge leakage in the circuit 400 (e.g., by the leakage detection component 201-*c*).

Figure 5:
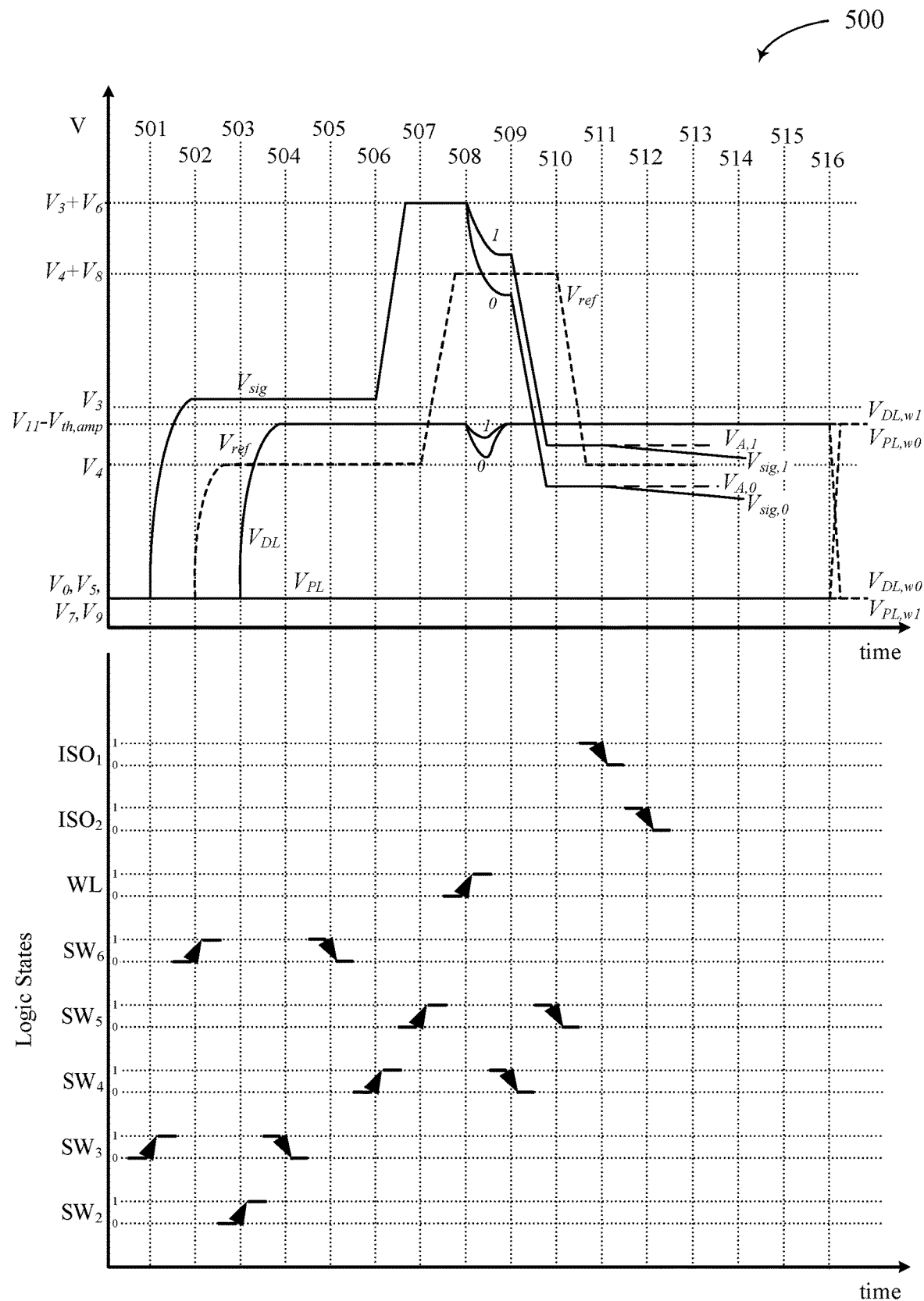
FIG. 5 shows a timing diagram illustrating operations of an example access procedure that supports memory management for charge leakage in accordance with examples as disclosed herein.

FIG. 5 shows a timing diagram 500 illustrating operations of an example access procedure that supports memory management for charge leakage in accordance with examples as disclosed herein. The example access procedure is described with reference to components of the example circuit 400 described with reference to FIG. 4.

In the example of timing diagram 500, voltage sources 410-*a*, 410-*f*, 410-*h*, and 410-*j* are considered to be grounded, and therefore at a zero voltage (e.g., $V_0$=0V, $V_5$=0V $V_7$=0V, and $V_9$=0V). However, in other examples voltage sources 410-*a*, 410-*f*, and 410-*h* may be at non-zero voltages, and the voltages of timing diagram 500 may thus be adjusted accordingly. In some examples, prior to initiating the operations of timing diagram 500, the digit line 210-*a* and the plate line 215-*a* may be controlled to the same voltage, which may minimize charge leakage across the memory cell 105-*b*. For example, according to the timing diagram 500, the digit line 210-*a* has an initial voltage of 0V, which may be the same as the initial voltage of the plate line 215-*a*. In other examples, the digit line 210-*a* and the plate line 215-*a* may have some other initial voltage different from the ground voltage.

At 501, the access procedure may include activating switching component 420-*c* (e.g., by activating logical signal $SW_3$). Activating switching component 420-*c* may connect voltage source 410-*d* with the signal line 260-*a*, and accordingly the voltage of signal line 260-*a* may rise to voltage level $V_3$ as charge flows into the integrator capacitor 430-*a*. Thus, activating switching component 420-*c* may initiate a precharging operation for the integrator capacitor 430-*a*. For example, at 501, the switching component 420-*d* may be deactivated, such that the voltage source 410-*f* (e.g., a ground or virtual ground voltage at 0V) is coupled with the second terminal 432-*a* of the integrator capacitor 430-*a*, and the voltage source 410-*d* is coupled with the first terminal 431-*a* of the integrator capacitor 430-*a*. Thus, the integrator capacitor 430-*a* may be charged according to the voltage difference between the voltage source 410-*d* and the voltage source 410-*f*.

At 502, the access procedure may include activating switching component 420-*f* (e.g., by activating logical signal $SW_6$). Activating switching component 420-*f* may connect voltage source 410-*e* with the reference line 265-*a*, and accordingly the voltage of reference line 265-*a* may rise to voltage level $V_4$ as charge flows into the integrator capacitor 430-*b*. Thus, activating switching component 420-*f* may initiate a precharging operation for the integrator capacitor 430-*b*. For example, at 502, the switching component 420-*e* may be deactivated, such that the voltage source 410-*h* (e.g., a ground or virtual ground voltage at 0V) is coupled with the second terminal 432-*b* of the integrator capacitor 430-*b*, and the voltage source 410-*e* is coupled with the first terminal 431-*b* of the integrator capacitor 430-*b*. Thus, the integrator capacitor 430-*b* may be charged according to the voltage difference between the voltage source 410-*e* and the voltage source 410-*h*.

At 503, the access procedure may include activating switching component 420-*b* (e.g., by activating logical signal $SW_2$). Activating switching component 420-*b* may initiate a precharging operation for the digit line 210-*a*. For example, activating switching component 420-*b* may connect the signal line 260-*a* with the digit line 210-*a*, which may be coupled with the voltage source 410-*a* (e.g., a ground or virtual ground voltage) by way of the intrinsic capacitance 240-*a*. As fed by the voltage source 410-*d*, charge may flow through the amplifier 405 and build on the digit line 210-*a*, causing the voltage on the digit line 210-*a* to rise. The voltage of the digit line 210-*a* may rise until the threshold voltage of the amplifier 405 (e.g., threshold voltage $V_{th,amp}$) is no longer exceeded. Thus, after activating switching component 420-*b*, the voltage of the digit line 210-*a* may rise to a voltage level of $V_{11}$-$V_{th,amp}$ as charge flows from the signal line (e.g., as fed by the voltage source 410-*d*, and the digit line 210-*a*, including intrinsic capacitance 240-*a*, may be charged according to the voltage difference between the voltage level $V_{11}$-$V_{th,amp}$ and the voltage source 410-*a* (e.g., 0V). In some examples, the voltage level $V_{11}$ may be selected such that the digit line 210-*a* is precharged to substantially the same level as the signal line 260-*a*. For example, the voltage level $V_{11}$ may be set at a level of $V_3$+$V_{th,amp}$, which may be provided by a voltage supply having a voltage level greater than voltage source 410-*d*. Thus, in some examples, the digit line 210-*a* may rise to a voltage level equal to voltage level $V_3$ in response to activating switching component 420-*b* at 503. In some examples, the voltage between the digit line 210-*a* and the plate line 215-*a* after the operations of 503 may correspond to the read voltage 335 described with reference to FIG. 3B.

Additionally or alternatively, in some examples, the digit line 210-*a* may be precharged by the voltage source 410-*c*. For example, prior to activating switching component 420-*b*, the timing diagram 500 may include activating switching component 420-*a* (e.g., by activating logical signal $SW_1$). Activating switching component 420-*a* may initiate an alternative precharging operation for the digit line 210-*a* that is not shown in timing diagram 500. As fed by the voltage source 410-*c*, charge may build on the digit line 210-*a*, causing the voltage on the digit line 210-*a* to match the voltage level $V_2$. In some examples, the voltage level $V_2$ may be substantially equal to the voltage level $V_3$, such that the digit line 210-*a* and the signal line 260-*a* are precharged to the same voltage prior to activating switching component 420-*b*. In some examples, precharging the digit line 210-*a* with the voltage source 410-*c* may reduce power consumption or reduce precharge time associated with accessing the memory cell 105-*b*. Following a precharge of the digit line 210-*a* by the voltage source 410-*c*, the access procedure may include activating switching component 420-*b* (e.g., by activating logical signal $SW_2$) to connect the signal line 260-*a* to the digit line 210-*a*.

At 504, the access procedure may include deactivating the switching component 420-*c* (e.g., by deactivating logical signal $SW_3$). Deactivating switching component 420-*c* may isolate voltage source 410-*d* from the signal line 260-*a*, and the voltage of signal line 260-*a* may hold at voltage level $V_3$. Upon deactivating the switching component 420-*c* the signal line 260-*a*, and thus the first terminal 431-*a* of the integrator capacitor 430-a, may be floating, and the signal line 260-a may maintain a level of charge according to the capacitance of the signal line 260-a, including the capacitance of the integrator capacitor 430-a.

At 505, the access procedure may include deactivating the switching component 420-f (e.g., by deactivating logical signal $SW_6$). Deactivating switching component 420-f may isolate voltage source 410-i from the reference line 265-a, and the voltage of reference line 265-a may hold at voltage level $V_4$. Upon deactivating the switching component 420-f the reference line 265-a, and thus the first terminal 431-b of the integrator capacitor 430-b, may be floating, and the reference line 265-a may maintain a level of charge according to the capacitance of the signal line 260-a, including the capacitance of the integrator capacitor 430-b.

At 506, the access procedure may include activating switching component 420-d (e.g., by activating logical signal $SW_4$). Activating switching component 420-d may cause a transition from the voltage source 410-f being coupled with the second terminal 432-a of the integrator capacitor 430-a to the voltage source 410-g being coupled with the second terminal 432-a of the integrator capacitor 430-a. By connecting the second terminal 432-a of the integrator capacitor 430-a to a voltage source at a higher voltage, the charge stored by the integrator capacitor 430-a may be boosted to a higher voltage, and accordingly the voltage of signal line 260-a, coupled with the first terminal 431-a of the integrator capacitor 430-a, may rise to voltage level ($V_3$+$V_6$). Thus, activating switching component 420-d may initiate a boosting operation for the integrator capacitor 430-a.

At 507, the access procedure may include activating switching component 420-e (e.g., by activating logical signal $SW_5$). Activating switching component 420-e may cause a transition from the voltage source 410-h being coupled with the second terminal 432-b of the integrator capacitor 430-b to the voltage source 410-i being coupled with the second terminal 432-b of the integrator capacitor 430-b. By connecting the second terminal 432-b of the integrator capacitor 430-b to a voltage source at a higher voltage, the charge stored by the integrator capacitor 430-b may be boosted to a higher voltage, and accordingly the voltage of reference line 265-a, coupled with the first terminal 431-b of the integrator capacitor 430-b, may rise to voltage level ($V_4$+$V_8$). Thus, activating switching component 420-e may initiate a boosting operation for the integrator capacitor 430-b.

At 508, the access procedure may include selecting the memory cell 105-b (e.g., by activating a word line via logical signal WL). Selecting the memory cell 105-b may cause a capacitor of the memory cell 105-b to be coupled with the digit line 210-a. Accordingly, charge may be shared between the memory cell 105-b, the digit line 210-a, and the signal line 260-a, which may depend on the logic state (e.g., charge state, polarization state) stored in the memory cell 105-b.

For example, when the memory cell 105-b stores a logic 1, the capacitor of the memory cell 105-b may store a positive charge (e.g., a charge state 305-a as described with reference to FIG. 3). Thus, when memory cell 105-b storing a logic 1 is selected, a relatively small amount of charge may flow from the digit line 210-a to the memory cell 105-b. As charge flows from the digit line 210-a to the memory cell 105-b, the voltage of the digit line 210-a may drop, which may allow the threshold voltage of the amplifier 405 to be exceeded. When the threshold voltage of the amplifier 405 is exceeded, charge may flow from the signal line 260-a (e.g., from the integrator capacitor 430-a) to the digit line 210-a across the amplifier 405, as well as a relatively small amount of charge from the voltage source 410-l, depending on the characteristics of the amplifier 405. Accordingly, charge may flow to the digit line 210-a until the voltage of the digit line 210-a returns to the voltage level equal to $V_{11}-V_{th,amp}$. When selecting the memory cell 105-b storing a logic 1, because a relatively small amount of charge flows into the memory cell 105-b, the signal line 260-a may undergo a relatively small voltage drop after selecting the memory cell 105-b, illustrated by the voltage of $V_{sig,1}$.

Alternatively, when the memory cell 105-b stores a logic 0, the capacitor of the memory cell 105-b may store a negative charge (e.g., charge state 310-a as described with reference to FIG. 3). Thus, when memory cell 105-b storing a logic 0 is selected, a relatively large amount of charge may flow from the digit line 210-a to the memory cell 105-b. Accordingly, the signal line 260-a may undergo a relatively larger voltage drop, illustrated by the voltage of $V_{sig,0}$, as charge flows through the amplifier 405 to return the digit line to the voltage level $V_{11}-V_{th, amp}$, such that the threshold voltage $V_{th,amp}$ of the amplifier 405 is no longer exceeded. In some examples, selecting the memory cell 105-b storing a logic 0 may result in a partial loss of polarization of a capacitor of the memory cell 105-b. In examples where a 2Pr sensing operation is employed, selecting the memory cell 105-b storing a logic 0 may result in a reversal of saturation polarization of the capacitor of the memory cell 105-b, such that an amount of charge associated with twice the saturation polarization flows into the memory cell 105-b. In either case, selecting a memory cell 105-b storing a logic 0 according to the present example may require a subsequent refresh or rewrite operation.

At 509, the access procedure may include deactivating switching component 420-d (e.g., by deactivating logical signal $SW_4$). Deactivating switching component 420-d may cause a transition from the voltage source 410-g being coupled with the second terminal 432-a of the integrator capacitor 430-a to the voltage source 410-f being coupled with the second terminal 432-a of the integrator capacitor 430-a. By connecting the second terminal 432-a of the integrator capacitor 430-a to the voltage source at a lower voltage, the charge stored by the integrator capacitor 430-b may be shifted to a lower voltage, and accordingly the voltage of signal line 260-a, coupled with the first terminal 431-a of the integrator capacitor 430-a, may drop by voltage level of ($V_6-V_5$, or just $V_6$ in the event that voltage source 410-f is coupled with a common ground point). Thus, deactivating switching component 420-d may initiate a shifting operation for the integrator capacitor 430-a, which may reduce the voltage of the signal line 260-a to a level that may be read by the sense amplifier 290-a. For example, after the shifting operation of 509, $V_{sig,1}$ may be approximately 1.5V as sensed by the sense amplifier 290-a, and $V_{sig,0}$ may be approximately 1.2V as sensed by the sense amplifier 290-a.

At 510, the access procedure may include deactivating switching component 420-e (e.g., by deactivating logical signal $SW_5$). Deactivating switching component 420-e may cause a transition from the voltage source 410-i being coupled with the second terminal 432-b of the integrator capacitor 430-b to the voltage source 410-h being coupled with the second terminal 432-b of the integrator capacitor 430-b. By connecting the second terminal 432-b of the integrator capacitor 430-b to the voltage source at a lower voltage, the charge stored by the integrator capacitor 430-b may be shifted to a lower voltage, and accordingly the voltage of reference line 265-a, coupled with the first terminal 431-*b* of the integrator capacitor 430-*b*, may drop by voltage level of ($V_8$–$V_7$, or just $V_8$ in the event that voltage source 410-*h* is coupled with a common ground point). Thus, deactivating switching component 420-*e* may initiate a shifting operation for the integrator capacitor 430-*b*, which may reduce the voltage of the reference line 265-*a* to a level that may be read by the sense amplifier 290-*a*. For example, after the shifting operation of 510, $V_{ref}$ may be approximately 1.35V as sensed by the sense amplifier 290-*a*.

At 511, the access procedure may include isolating the sense amplifier 290-*a* from the signal line 260-*a* by deactivating switching component 420-*g* (e.g., by deactivating logical signal $ISO_1$). Isolating the sense amplifier 290-*a* from the signal line 260-*a* may allow the sense amplifier 290-*a* to store a voltage or charge associated with the signal line voltage (e.g., $V_A$=$V_{sig}$, at the first terminal 131-*b* of the sense amplifier 290-*a*) prior to determining the logic state stored in the memory cell 105-*b*.

At 512, the access procedure may include isolating the sense amplifier 290-*a* from the reference line 265-*a* by deactivating switching component 420-*h* (e.g., by deactivating logical signal $ISO_2$). Isolating the sense amplifier 290-*a* from the reference line 265-*a* may allow the sense amplifier 290-*a* to store a voltage or charge associated with the reference line voltage (e.g., $V_B$=$V_{ref}$, at the second terminal 132-*b* of the sense amplifier 290-*a*) prior to determining the logic state stored in the memory cell 105-*b*.

At 513, the access procedure may include detecting a difference between the stored voltages at the first terminal 131-*b* and the second terminal 132-*b* of the sense amplifier 290-*a*, which may be referred to as "latching" the result of accessing the memory cell 105-*b* or detecting the logic state stored by the memory cell 105-*b*. For example, if the signal stored at the first terminal 131-*b* is greater than the signal stored at the second terminal 132-*b* (e.g., $V_A$>$V_B$), the sense amplifier 290-*a* may output a voltage equal to the high voltage source of the sense component (e.g., $V_{10}$, associated with voltage source 410-*k*, corresponding to a logic 1). If the signal stored at the first terminal 131-*b* is less than the signal stored at the second terminal 132-*b* (e.g., $V_A$<$V_B$), the sense amplifier 290-*a* may output a voltage equal to the low voltage source of the sense component (e.g., $V_9$, associated with voltage source 410-*j*, corresponding to a logic 0). The detected logic state may be output to an input/output component 160, a memory controller 170, or other components of a memory device 100 that includes the circuit 400 for subsequent operations.

In some examples, charge may leak from one portion of the circuit 400 to another during the operations of the timing diagram 500. In one example, charge leakage may follow a path "A" from the digit line 210-*a* to the plate line 215-*a*, which may illustrate a charge leakage through the memory cell 105-*b* (e.g., across a dielectric portion of a capacitor 220 of the memory cell 105-*b* or otherwise around a dielectric portion of the capacitor). In another example, leakage may follow a path "B" from the digit line 210-*a* to the voltage source 410-*a*, which may illustrate a charge leakage from the digit line 210-*a* to a ground voltage source or reference voltage or component (e.g., a chassis leakage). Other examples, not illustrated, may include other leakage paths that permit any other charge transfer between the digit line 210-*a* and another component of the circuit 400, or the signal line 260-*a* and another component of the circuit 400. In some examples, charge leakage in the circuit 400 may be driven by a difference in voltage between the digit line 210 and the plate line 215, and may be relatively high when the cell selection component 230-*a* is activated (e.g., for cell-specific charge leakage associated with the memory cell 105-*b*). Accordingly, charge leakage may be relatively high after 508, when the word line 205-*a* is activated and the difference between $V_{DL}$ and $V_{PL}$ is relatively large (e.g., when the memory cell 105-*b* is under full bias).

In some examples, such charge leakage may alter one or more of the signals illustrated in timing diagram 500. For example, such charge leakage may be associated with additional charge transfer across the amplifier 405 as the digit line 210-*a* is maintained at a particular voltage level, which may be accompanied by a lower voltage of the signal line 260-*a*, $V_{sig}$, than shown in timing diagram 500. When the memory cell 105-*b* stores a logic 1, for example, such leakage may therefore be accompanied by a reduced difference between $V_{sig,1}$ and $V_{ref}$, which may reduce a read margin associated with reading a logic 1, or such leakage may cause $V_{sig,1}$ to fall below $V_{ref}$, which may cause the memory cell 105-*b* written with a logic 1 being incorrectly read as a logic 0. Thus, to improve the likelihood that the memory cell 105-*b* is correctly read, in some examples, the access operation may include determining whether to perform a direct write operation (e.g., a direct rewrite operation) or a complementary write operation (e.g., a complementary rewrite operation) based at least in part on a detected charge leakage in the circuit 400.

At 514, the access operation may include detecting a charge leakage in the circuit 400. For example, the leakage detection component 201-*c* may be configured to monitor the voltage of the signal line 260-*a*, which may include detecting a drop in $V_{sig}$ (e.g., a change in $V_{sig}$, a time derivative or voltage of $V_{sig}$) or comparing $V_{sig}$ to a threshold (e.g., a charge detection reference voltage, which may be a configurable voltage that is different than $V_{ref}$). In one example, the leakage detection component 201-*c* may be configured to detect a change in $V_{sig}$ after isolating the signal line 260-*a* from the sense amplifier 290-*a* (e.g., a drop in $V_{sig}$ after 511, as illustrated), which may include a comparison between $V_{sig}$ of the signal line 260-*a* and $V_A$ of the sense amplifier 290-*a* at 513. However, this is only one example of how charge leakage may be detected in the circuit 400. For example, according to a different set of operations, the signal line 260-*a* may be biased to some voltage after the isolation from the sense amplifier 290-*a* (e.g., after 511), where the voltage may be the same regardless of whether the memory cell 105-*b* stored a logic 0 or a logic 1. In another example, the signal line 260-*a* may be re-coupled with the sense amplifier 290-*a* (e.g., after detecting a logic state at 513, by activating the switching component 420-*g* via logical signal $ISO_1$), which may be accompanied by the signal line 260-*a* being biased to a voltage that may be the same or different depending on the logic state originally stored by the memory cell 105-*b*. In various examples, the voltage of the signal line 260-*c* may fall from such a set voltage as a result of charge leakage, and corresponding charge transfer across the amplifier 405, which may be detected by the leakage detection component 201-*c* at 514. In some examples, such a leakage detection may be performed at the integrator capacitor 430-*a*, which may be associated with detecting a voltage or change in voltage across the integrator capacitor 430-*a*, or detecting a charge state or change in charge state of the integrator capacitor 430-*a*. In some examples, the leakage detection component 201-*c*, or some other component, may store an indication of whether leakage was detected at 514 (e.g., a temporary indication associated with the access operation of timing diagram 500, a cell-specific indication, an access line-specific indication).

At 515, the access operation may include determining whether to perform a direct rewrite operation or a complementary rewrite operation, which may be based at least in part on whether charge leakage is detected in the circuit 400. For example, if charge leakage is detected at 514, the access operation may determine to write a complement of the logic state detected in the memory cell 105-*b* (e.g., at 513).

In some examples, determining whether to write a complementary logic state may be further based on the particular logic state detected in the memory cell 105-*b*. For example, when charge leakage is detected at 514, it may be preferable that the memory cell 105-*b* stores a logic state associated with relatively large charge transfer. Using the example of hysteresis plots 300-*a* and 300-*b*, a logic 0 may be associated with a relatively large charge transfer (e.g., a difference in charge between charge states 310-*a* and 370) and a logic 1 may be associated with a relatively small charge transfer (e.g., a difference in charge between charge states 305-*a* and 370). Thus, according to this example, it may be preferable that the memory cell 105-*b* stores a logic 0 if charge leakage is detected (e.g., based on accessing the memory cell 105-*b*) at 514. Accordingly, at 515, when the memory cell 105-*b* is detected to have stored a logic 1 (e.g., at 513) it may be determined to write a complement of the stored logic state (e.g., rewriting the memory cell 105-*b* with a logic 0), and when the memory cell 105-*b* is detected to have stored a logic 0 (e.g., at 513) it may be determined to directly write the stored logic state (e.g., rewriting the memory cell 105-*b* with a logic 0). In some examples, such a determination may include identifying that a selective rewrite operation needs to be performed, since, as a result of the operations of 508 through 515, the memory cell 105-*b* may be positively saturated (e.g., at least temporarily charged according to a logic 1, such as charge state 370 described with reference to FIG. 3B). In some examples, a memory device 100 may store an indication of whether it was determined at 514 to write a complementary logic state to the memory cell 105-*b*. However, in some examples, such an indication may not be determined, stored, or validated until after the corresponding write operation is performed or confirmed (e.g., in a subsequent operation).

In some examples, determining whether to perform a direct rewrite operation or a complementary rewrite operation may be based on a set of memory cells 105, such as a row of memory cells 105, a page of memory cells 105, or some other set of memory cells 105 that share the word line 205-*a* with the memory cell 105-*b*. For example, when determining whether to perform a direct or complementary rewrite operation corresponds to a set of memory cells 105, the operations of 501 through 514 may be repeated (e.g., simultaneously, during overlapping time intervals) for duplicate components of the circuit 400 (not shown) that are associated with respective memory cells 105 of the set (e.g., parallel sense amplifiers 290, parallel signal lines 260, parallel amplifiers 405, parallel digit lines 210). In such examples, the determination of whether to perform a direct rewrite operation on the set of memory cells 105 or a complementary rewrite operation on the set of memory cells 105 may be based at least in part on minimizing a number of leaky memory cells 105, or corresponding access lines (e.g., digit lines 210, signal lines 260), that are to store a logic state associated with relatively low charge transfer.

For example, continuing the example illustrated by hysteresis plots 300-*a* and 300-*b*, it may be preferable to minimize the number of memory cells 105 in the set, associated with a detected charge leakage that is above a threshold, that are to store a logic 1. Accordingly, at 515, a memory device 100 (e.g., a memory controller 170) may digitally combine the result of charge leakage detection for a set or memory cells 105 with a pattern of data to be used for writeback to the set of memory cells 105 in order to assign a logic 0 to as many leaky memory cells 105, or corresponding access lines, as possible. In such examples, memory cells 105, or corresponding access lines, that are not associated with a detected charge leakage may be ignored in the digital combination, since they may not be adversely affected by storing one logic state or another.

Because a determination of whether to perform a direct or complementary rewrite operation may be based on a set of memory cells 105, the particular determination of a logic state for the rewrite operation of the memory cell 105-*b* may not necessarily be based only on whether charge leakage is detected at 514 for the memory cell 105-*b*. For example, a memory device 100 may determine to write a complement of a logic state detected for the memory cell 105-*b*, despite no charge leakage being detected for the memory cell 105-*b*, or associated access lines, when other memory cells 105 in a set that includes the memory cell 105-*b* are determined to benefit from performing a complementary rewrite operation. In other words, depending on the determination made for the set of memory cells 105, a logic state written to a particular memory cell 105 of the set may be a complement to the detected logic state of the particular memory cell 105, despite charge leakage not being detected for the particular memory cell 105.

In some examples, the described techniques may be combined with other error correction techniques, such as an error correction code (ECC), a one-bit ECC (e.g., ECC1) or single error correction (SEC). In some examples, such a combination may support up to 3 bits of correction for a particular row or page access scheme. In other words, when using the described techniques for memory management based on detected charge leakage, the result may be a 3-bit ECC equivalent using a 1-bit ECC engine.

In one example of combining ECC with the described techniques for flipping data based on charge leakage detection, a page access operation may be associated with a single memory cell 105 or corresponding access line (e.g., digit line 210, signal line 260) of the page having a charge leakage detected above a threshold. In such examples, a memory device 100 may determine to flip the data for the page when the memory cell 105 is initially associated with a logic state associated with a relatively small charge transfer (e.g., inverting a logic 1 for the memory cell 105 to a logic 0 for the memory cell 105, and correspondingly inverting the other logic states for the other memory cells 105 in the page). Alternatively, a memory device 100 may determine to not flip the data for the page when the memory cell 105 is initially associated with a logic state associated with a relatively small charge transfer, and instead rely on ECC to correct for a possible error in reading the memory cell 105. When the memory cell 105 is initially associated with a logic state associated with a relatively large charge transfer, the memory device 100 may determine to not flip the data for the page because the charge leakage may not adversely affect reading the memory cell 105. Thus, in each of these cases, the memory device 100 may properly read the memory cells 105 in the page, despite the charge leakage being above the threshold for a single memory cell 105 or corresponding access lines.

In another example of combining ECC with the described techniques for flipping data based on charge leakage detection, a page access operation may be associated with two memory cells 105 or corresponding access lines (e.g., digit line 210, signal line 260) of the page having a charge leakage detected above a threshold. In such examples, a memory device 100 may determine to flip the data for the page when the two memory cells 105 are initially associated with a logic state associated with a relatively small charge transfer (e.g., inverting a logic 1 for the memory cell 105 to a logic 0 for the memory cell 105, and correspondingly inverting the other logic states for the other memory cells 105 in the page). Thus, neither of the memory cells 105 associated with a charge leakage would be storing a logic state associated with a relatively small charge transfer. When the two memory cells 105 are initially associated with different logic states (e.g., one being associated with relatively large charge transfer and the other being associated with relatively small charge transfer), a memory device 100 may determine to flip the data for the page or to not flip the data for the page, since, whether flipped or not, reading of one of the memory cells 105 may not be adversely affected by charge leakage (e.g., due to storing a logic state associated with relatively large charge transfer), and reading of the other of the memory cells 105 may be corrected by ECC to handle a possible error in reading the memory cell 105 due to charge leakage. When the two memory cells 105 are initially associated with a logic state associated with a relatively large charge transfer, the memory device 100 may determine to not flip the data for the page because the charge leakage may not adversely affect reading the two memory cells 105. Thus, in each of these cases, the memory device 100 may properly read the memory cells 105 in the page, despite the charge leakage being above the threshold for two memory cells 105 or corresponding access lines.

In another example of combining ECC with the described techniques for flipping data based on charge leakage detection, a page access operation may be associated with three memory cells 105 or corresponding access lines (e.g., digit line 210, signal line 260) of the page having a charge leakage detected above a threshold. In such examples, a memory device 100 may determine to flip the data for the page when the three memory cells 105 are initially associated with a logic state associated with a relatively small charge transfer (e.g., inverting a logic 1 for the memory cell 105 to a logic 0 for the memory cell 105, and correspondingly inverting the other logic states for the other memory cells 105 in the page). Thus, none of the memory cells 105 associated with a charge leakage would be storing a logic state associated with a relatively small charge transfer.

When the three memory cells 105 are initially associated with different logic states (e.g., one being associated with relatively large charge transfer and the other being associated with relatively small charge transfer), a memory device 100 may determine to flip the data for the page or to not flip the data for the page. For example, when two of the memory cells 105 are storing a logic state associated with a relatively large charge transfer, the memory device may determine to not flip the data for the page, and when two of the memory cells 105 are storing a logic state associated with a relatively small charge transfer, the memory device may determine to flip the data for the page. In either case, a subsequent reading of the page may rely on ECC to handle a possible error in reading one of the memory cell 105 (e.g., the one of the memory cells 105 that subsequently store a logic state associated with a relatively small charge transfer) due to charge leakage. When the three memory cells 105 are initially associated with a logic state associated with a relatively large charge transfer, the memory device 100 may determine to not flip the data for the page because the charge leakage may not adversely affect reading the three memory cells 105. Thus, in each of these cases, the memory device 100 may properly read the memory cells 105 in the page, despite the charge leakage being above the threshold for three memory cells 105 or corresponding access lines.

At 516, the access operation may include performing a write operation (e.g., a write portion of the access operation, a rewrite portion of the access operation). For example, returning to the example of hysteresis plot 300-a, at 514, the access operation may include applying a voltage 315 (e.g., a plate low write voltage, where $V_{DL,w1}>V_{PL,w1}$) when the memory cell 105-b is determined to store a logic 1, or the access operation may include applying a voltage 325 (e.g., a plate high write voltage, where $V_{PL,w0}>V_{DL,w0}$) when the memory cell 105-b is determined to store a logic 0. In some examples, applying a voltage 315 at 516 may be omitted, because the memory cell 105-b may already be storing a positively saturated charge state (e.g., a logic 1, due to one of more of the operations of 508 through 515). In such examples, the plate line 215-a may still be taken to a high voltage (e.g., a voltage associated with writing a logic 0), but the digit line 210-a may also be taken to the high voltage (e.g., where $V_{DL}=V_{PL}$), such that the voltage of memory cell 105 is equalized and accordingly maintains the positively saturated charge state (e.g., the logic 1).

In some examples, performing the write operation at 516 may be based at least in part on determining to write a complement of the identified logic state stored by the memory cell 105-b (e.g., at 513). In such examples, the write operation at 516 may include an inversion of aspects of memory cell writing compared to when it is determined not to write the complement of the identified logic state. For example, when it is determined to write a complement of the identified logic state, the write operation at 516 may include swapping voltages or connected voltage sources (e.g., swapping a voltage or voltage source between the plate line 215-a and the digit line 210-a), grounding the digit line 210-a that would otherwise be held at a relatively high voltage, or performing some other logical inversion on another component that manages the write or rewrite operations of 516.

Although illustrated as separate operations occurring at different times, some operations may occur simultaneously, or in a different order. In some examples, various operations may be advantageously initiated simultaneously in order to reduce the amount of time required to sense a logic state of the memory cell 105-b. For example, the initiation of precharging at 501 and 502 may occur in an opposite order, or simultaneously (e.g., when logical signals $SW_3$ and $SW_6$ are driven as a common logical signal). Further, connecting the digit line 210-a with the signal line 260-a at 503 may occur prior to 501 or 502, or all three operations may occur simultaneously. Boosting the signal line 260-a at 506 and boosting the reference line 265-a at 507 may also occur in an opposite order, or simultaneously (e.g., when using a common variable voltage source 450, or when logical signals $SW_4$ and $SW_5$ are driven as a common logical signal). Similarly, shifting the signal line 260-a at 509 and shifting the reference line 265-a at 510 may also occur in an opposite order or simultaneously. In some examples, isolating the sense amplifier 290-a from the signal line 260-a at 511 and isolating the sense amplifier 290-a from the reference line 265-a at 512 may occur in an opposite order, or simultaneously (e.g., when logical signals $ISO_1$ and $ISO_2$ are driven as a common logical signal).

In some examples, boosting and shifting of the reference line 265-a may be eliminated altogether, and thus operations at 507 and 510 may be omitted. Thus, in some embodiments of the described techniques, the second integrator capacitor 430-*b* and the second variable voltage source 450-*b* may be omitted from the circuit 400, and self-boost may still be supported for signal generation when accessing the memory cell 105-*b*. Additionally or alternatively, in some examples, boosting and shifting of the signal line 260-*a* may be eliminated altogether, and thus operations at 506 and 509 may be omitted. Thus, in some embodiments of the described techniques, the first integrator capacitor 430-*a* and the first variable voltage source 450-*a* may be omitted from the circuit 400.

The order of operations shown in timing diagram 500 is for illustration purposes, and various other orders and combinations of steps may be performed to support the described techniques. Further, the timing of the operations of timing diagram 500 is also for illustration purposes, and is not meant to indicate a particular relative duration between one operation and another. Various operations may occur over a duration that is relatively shorter or relatively longer than illustrated in various embodiments of self-boost in accordance with the present disclosure.

The transitions of the logical signals of the timing diagram 500 are illustrative of transitions from one state to another, and generally reflect transitions between an enabled or activated state (e.g., state "0") and a disabled or deactivated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a curve over time from one logical state to another. Thus, the transitions shown in timing diagram 500 are not necessarily indicative of an instantaneous transition. Further, the initial state of a logical signal associated with a transition at a numbered operation may have been arrived during various times preceding the numbered operation while still supporting the described transitions and associated operations.

Although the example of timing diagram 500 illustrates how the described techniques for leakage detection and logic inversion may be applied in a read operation, the described techniques may also be combined with a write operation. For example, leakage detection operations such as those described herein may be performed before writing a logic state to a memory cell 105 or a set of memory cells 105 (e.g., during a leakage detection portion of a write operation, during an operation for determining which type or write operation to perform). In some examples, a write operation may accordingly be modified of performed depending on a determination of whether to perform a direct write operation or a complementary write operation on the memory cell 105 or set of memory cells 105 (e.g., based on whether charge leakage is detected before writing a logic state to a memory cell, and whether the logic state is associated with relatively a large or small amount of charge transfer).

In another example, leakage detection operations such as those described herein may be performed after writing a logic state to a memory cell 105 or a set of memory cells 105 (e.g., during a leakage detection portion of the write operation, during a write validation or confirmation portion of the write operation), and the write operation may accordingly be modified or performed depending on whether writing the logic state was successful on the memory cell 105 or set of memory cells 105. For example, after performing a direct write operation on a page of memory cells 105, if charge leakage is detected in the page of memory cells 105, and the charge leakage is associated with writing, to a leaky memory cell 105 or corresponding access line, a logic state that is associated with a relatively small amount of charge transfer, the write operation may be modified to include performing a complementary write operation on the page of memory cells 105 (e.g., in a rewrite portion of the write operation).

Figure 6:
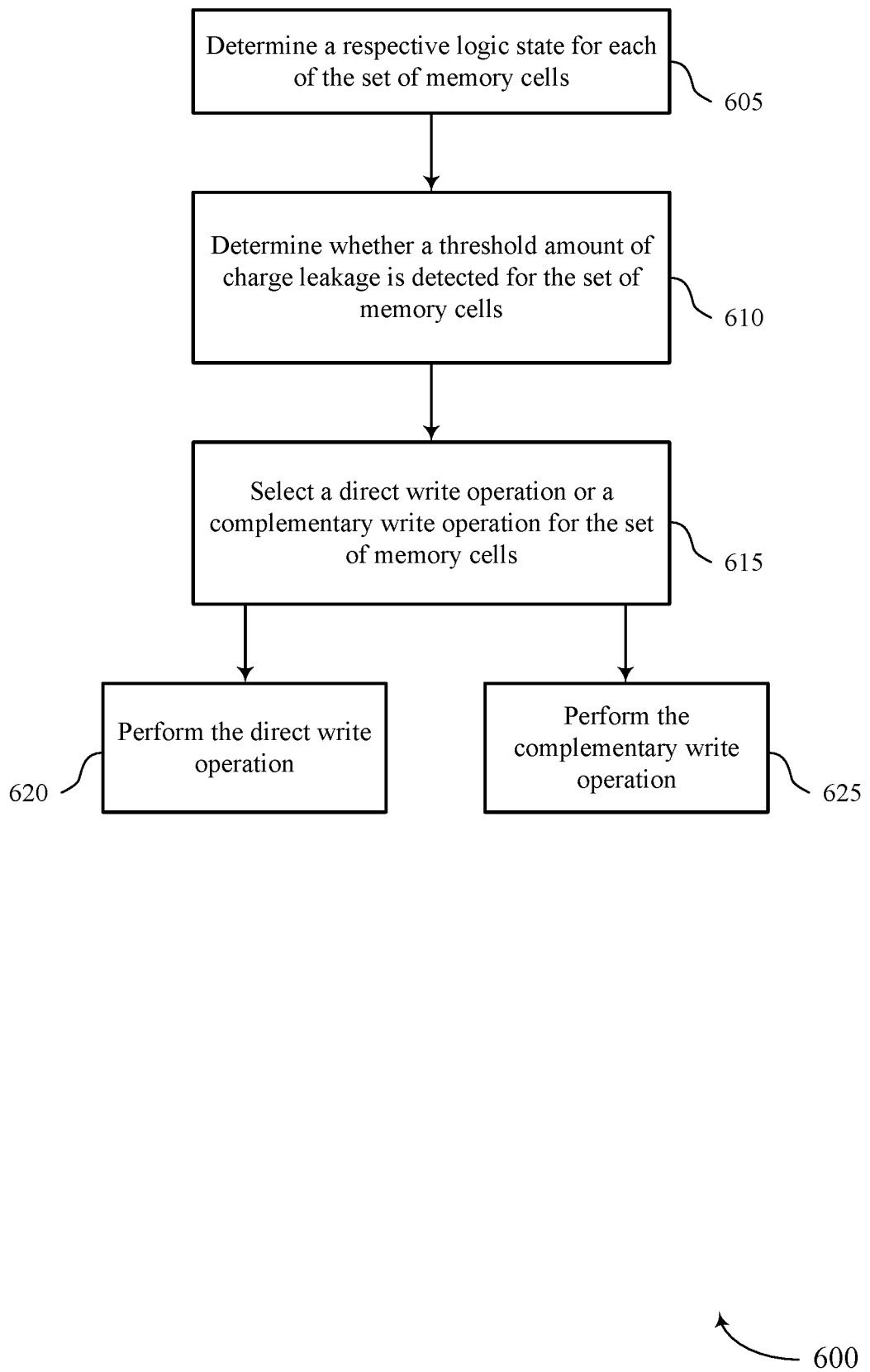
FIG. 6 shows a flowchart illustrating a method that supports memory management for charge leakage in accordance with examples as disclosed herein.

FIG. 6 shows a flowchart illustrating a method 600 that supports memory management for charge leakage in accordance with examples as disclosed herein. The operations of method 600 may be implemented by a memory device 100 or its components as described herein. In some examples, the memory device 100 may include a set of memory cells 105 (e.g., a plurality of memory cells 105, an array of memory cells 105), and each of the memory cells 105 may include a respective storage element (e.g., a respective capacitive storage element). Operations of the method 600 may be performed by various components or circuitry coupled with the set of memory cells (e.g., coupled with a row of memory cells 105, a page of memory cells 105), including examples described with reference to FIGS. 1 through 5. In some examples, the operations of method 600 may illustrate an access operation of a set of memory cells 105 (e.g., a read operation, a write operation, a rewrite operation, a refresh operation), or some portion thereof.

At 605, the method may include determining a respective logic state for each of the set of memory cells 105. In some examples, determining the respective logic states may be based at least in part on coupling the storage element of each of the set of memory cells 105 with a respective one of a set of access lines (e.g., digit lines 210, signal lines 260), or some other operation that includes determining respective logic states already stored by the memory cells 105 (e.g., in a read operation, in a rewrite operation, in a refresh operation). In some examples, such a coupling may be based on activating a common selection line (e.g., a common word line 205). In some examples, determining the respective logic states may be based at least in part on some other determination of logic states to be stored by the memory cells 105 (e.g., in a subsequent writing of the memory cells, in a subsequent write operation, in an operation that does not include accessing the memory cells 105). For example, logic states for each of the memory cells 105 may be provided from a memory controller 170 as part of a write operation (e.g., writing or overwriting information to the memory cells 105).

At 610, the method may include determining whether a threshold amount of charge leakage is detected on one or more of a set of access lines (e.g., digit lines 210, signal lines 260). In some examples, each of the memory cells 105 may be coupled with a respective one of the set of access lines. In some examples, determining whether the threshold amount of charge leakage is detected may be performed after coupling the memory cells 105 with their respective one of the set of access lines. In some examples, charge leakage may have been detected in some other previous operation. In some examples, the detection of charge leakage may be otherwise triggered by the initiation of an access operation (e.g., a read operation, a write operation, a rewrite operation, a refresh operation).

In some examples, determining the respective logic state for each of the set of memory cells at 605 may include latching a signal of a respective signal line 260 associated with the respective memory cell 105, and determining whether the threshold amount of charge leakage is detected at 610 may be based on comparing a voltage of the respective signal line 260 to a threshold voltage after the latching. In some examples, determining whether the threshold amount of charge leakage is detected may be based on detecting (e.g., directly or indirectly) a flow of charge across a signal development component 280 (e.g., a transistor, an amplifier 405) that is electrically connected with a respective one of the set of access lines.

At 615, the method may include selecting a direct write operation or a complementary write operation for the set of memory cells 105. In some examples, selecting the direct or complementary write operation may be based on the whether the threshold amount of charge leakage is detected on one or more of the set of access lines. In some examples, the method 600 may be associated with a first logic state corresponding to a first amount of charge transfer and a second logic state corresponding to a second amount of charge transfer that is lower than the first amount of charge transfer. In such examples, selecting the direct write operation or the complementary write operation may be based on a quantity of the set of access lines associated with a detection of the threshold amount of charge leakage and coupled with a memory cell storing the first logic state, and a quantity of the set of access lines associated with a detection of the threshold amount of charge leakage and coupled with a memory cell storing the second logic state. In some examples, the selection at 615 may be based at least in part on whether the described techniques are combined with another error correction scheme, such as ECC or ECC1. In some examples, the method 600 may further include storing an indication of whether the direct rewrite operation or the complementary rewrite operation was selected. When selecting to perform the direct write operation, the method may proceed to 625, and when selecting to perform the complementary write operation, the method may proceed to 630.

At 620, the may include performing the direct write operation. For example, performing the direct write operation may include writing, to each of the set of memory cells 105, the respective logic state determined at 605. In some examples, the method 600 may further include storing an indication that the direct write operation was performed.

At 625, the may include performing the complementary write operation. For example, performing the complementary write operation may include writing, to each of the set of memory cells 105, a complement of the respective logic state determined at 605. In some examples, the method 600 may further include storing an indication that the complementary write operation was performed.

According to the example of method 600, a set of memory cells 105 may be written with a direct write operation or a complementary write operation, where a selection between them may be made based at least in part on whether a threshold amount of charge leakage is detected. By performing operations such as those of the method 600, a memory device 100 may be more likely to properly read information from the set of memory cells 105. For example, the operations of the method 600 may be performed in a manner that minimizes a number of memory cells 105 or associated access lines that are to store a logic state corresponding to relatively little charge transfer, because such a logic state may be more vulnerable to being mis-read or read with a lower read margin than a logic state associated with relatively higher charge transfer.

Figure 7:
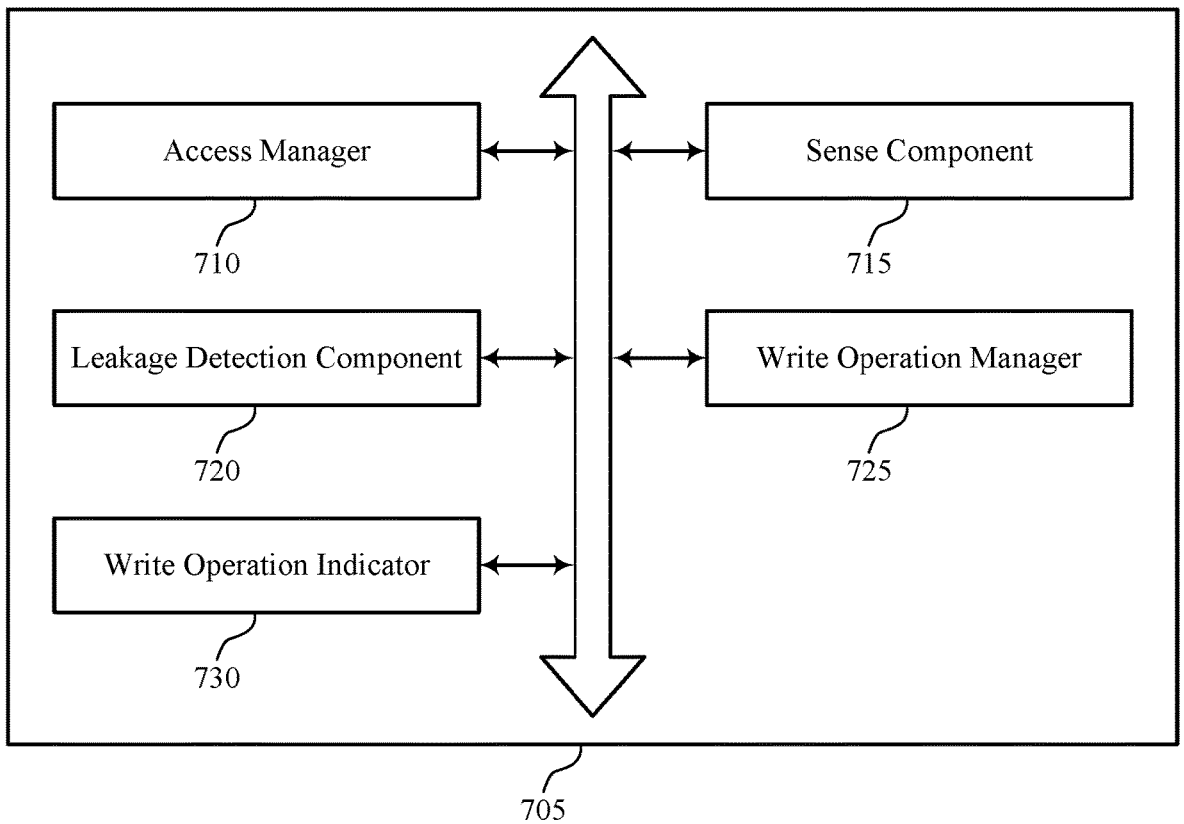
FIG. 7 shows a block diagram of a memory device that supports memory management for charge leakage in accordance with examples as disclosed herein.

FIG. 7 shows a block diagram 700 of a memory device 705 that supports memory management for charge leakage in accordance with examples as disclosed herein. The memory device 705 may be an example of aspects of a memory device as described with reference to FIGS. 1 through 5. The memory device 705 may include an access manager 710, a sense component 715, a leakage detection component 720, a write operation manager 725, and a write operation indicator 730. Each of these modules may communicate, directly or indirectly, with one another (e.g., via one or more buses).

The access manager 710 may access a memory cell. In some examples, accessing the memory cell includes activating a cell selection component for the memory cell. In some examples, the access manager 710 may access a second memory cell. In various examples, an accessed memory cell may include a capacitive storage element.

The sense component 715 may determine a logic state stored by the memory cell based on the accessing. In some examples, the sense component 715 may determine that the second memory cell stored the logic state based on accessing the second memory cell. In some examples, determining the logic state stored by the memory cell includes latching a signal of an access line associated with the memory cell. In some examples, the sense component 715 may determine a second logic state stored by a second memory cell, the second memory cell selected by an access line that is common with the memory cell.

The leakage detection component 720 may detect a charge leakage based on accessing the memory cell. In some examples, detecting the charge leakage is performed at least in part while the cell selection component is activated. In some examples, detecting the charge leakage includes determining that a voltage of the access line falls below a threshold voltage after the latching. In some examples, the leakage detection component 720 may detect a flow of charge across a transistor that is electrically connected between the memory cell and a sense component configured to determine that the memory cell stored the logic state. In some examples, the leakage detection component 720 may detect a second charge leakage based on accessing the second memory cell.

The write operation manager 725 may determine whether to write the logic state or a complement of the logic state to the memory cell based in part on detecting the charge leakage. In some cases, the logic state is associated with a first amount of charge transfer associated with the capacitive storage element and the complement of the logic state is associated with a second amount of charge transfer that is greater than the first amount of charge transfer. In some examples, the write operation manager 725 may determine whether to write the logic state or the complement of the logic state is based on the logic state being associated with a first amount of charge transfer and the complement of the logic state being associated with a second amount of charge transfer that is greater than the first amount of charge transfer. In some examples, the write operation manager 725 may write the determined logic state to the memory cell. In some examples, the write operation manager 725 may write the second logic state or the complement of the second logic state to the second memory cell based on the determination of whether to write the logic state or the complement of the logic state to the memory cell. In some examples, determining whether to write the logic state or the complement of the logic state to the memory cell is based on determining that another memory cell stored the logic state and detecting another charge leakage.

The write operation indicator 730 may store an indication of whether the logic state or the complement of the logic state was written to the memory cell. In some cases, the indication is associated with each memory cell of a set of memory cells that includes the memory cell. In some cases, each memory cell of the set of memory cells is selected by a common access line.

FIG. 8 shows a block diagram 800 of a memory device 805 that supports memory management for charge leakage in accordance with examples as disclosed herein. The memory device 805 may be an example of aspects of a memory device as described with reference to FIGS. 1 through 5. The memory device 805 may include a row component 810, a sense component 815, a leakage detection component 820, a rewrite operation determiner 825, a rewrite operation controller 830, and a rewrite operation indicator 835. Each of these modules may communicate, directly or indirectly, with one another (e.g., via one or more buses). In some examples, the memory device 805 may include a plurality of memory cells each including a respective storage element, and the described components may be included in a controller or circuitry coupled with the plurality of memory cells.

The row component 810 may couple a storage element of each of a set of memory cells with a respective one of a set of access lines. In some examples, the row component 810 may couple each memory cell with the respective one of the set of access lines based on activating a cell selection component associated with the respective memory cell. In some examples, the row component 810 may couple each memory cell of the set of memory cells with the respective one of the set of access lines based on activating a common selection line.

The sense component 815 may determine a respective logic state stored by each of the set of memory cells based on the coupling. In some examples, the sense component 815 may determine the respective logic state for each of the set of memory cells by latching a signal of a respective signal line associated with the respective memory cell.

The leakage detection component 820 may determine, after determining the respective logic states, whether a threshold amount of charge leakage is detected on one or more of the set of access lines. In some examples, the leakage detection component 820 may determine whether the threshold amount of charge leakage is detected on the one or more of the set of access lines at least in part while the cell selection component is activated. In some examples, the leakage detection component 820 may determine whether the threshold amount of charge leakage is detected based on comparing a voltage of the respective signal line to a threshold voltage after the latching. In some examples, the leakage detection component 820 may determine whether the threshold amount of charge leakage is detected on the one or more of the set of access lines is based on detecting a flow of charge across a transistor that is electrically connected with a respective one of the set of access lines.

The rewrite operation determiner 825 may select, based on the whether the threshold amount of charge leakage is detected on one or more of the set of access lines, a direct rewrite operation for each of the memory cells or a complementary rewrite operation for each of the memory cells. In some examples, for a first logic state associated with a first amount of charge transfer and a second logic state associated with second amount of charge transfer that is lower than the first amount of charge transfer, selecting the direct rewrite operation or the complementary rewrite operation is based at least in part on: (1) a quantity of the plurality of access lines associated with a detection of the threshold amount of charge leakage and coupled with a memory cell storing the first logic state, and (2) a quantity of the plurality of access lines associated with a detection of the threshold amount of charge leakage and coupled with a memory cell storing the second logic state.

The rewrite operation controller 830 may perform the selected direct rewrite operation or complementary rewrite operation on each of the set of memory cells. In some cases, the direct rewrite operation includes writing the respective logic state stored by a respective memory cell and the complementary rewrite operation includes writing a complement of the respective logic state stored by a respective memory cell.

The rewrite operation indicator 835 may store an indication of whether the direct rewrite operation or the complementary rewrite operation was selected.

FIG. 9 shows a flowchart illustrating a method or methods 900 that support memory management for charge leakage in accordance with examples as disclosed herein. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware or circuitry.

At 905, the memory device may access a memory cell having a capacitive storage element. The operations of 905 may be performed according to the methods described herein. In some examples, aspects of the operations of 905 may be performed by an access manager 710 as described with reference to FIG. 7.

At 910, the memory device may determine a logic state stored by the memory cell based on the accessing. The operations of 910 may be performed according to the methods described herein. In some examples, aspects of the operations of 910 may be performed by a sense component 715 as described with reference to FIG. 7.

At 915, the memory device may detect a charge leakage based on accessing the memory cell. The operations of 915 may be performed according to the methods described herein. In some examples, aspects of the operations of 915 may be performed by a leakage detection component 720 as described with reference to FIG. 7.

At 920, the memory device may determine whether to write the logic state or a complement of the logic state to the memory cell based in part on detecting the charge leakage. The operations of 920 may be performed according to the methods described herein. In some examples, aspects of the operations of 920 may be performed by a write operation manager 725 as described with reference to FIG. 7.

At 925, the memory device may write the determined logic state to the memory cell. The operations of 925 may be performed according to the methods described herein. In some examples, aspects of the operations of 925 may be performed by a write operation manager 725 as described with reference to FIG. 7.

In some examples, an apparatus as described herein may perform a method or methods, such as the method 900. The apparatus may include circuitry, features, means, or instructions (e.g., a non-transitory computer-readable medium storing instructions executable by a processor) for accessing a memory cell having a capacitive storage element, determining a logic state stored by the memory cell based on the accessing, detecting a charge leakage based on accessing the memory cell, determining whether to write the logic state or a complement of the logic state to the memory cell based in part on detecting the charge leakage, and writing the determined logic state to the memory cell.

Some examples of the method 900 and the apparatus described herein may further include operations, circuitry, features, means, or instructions for determining whether to write the logic state or the complement of the logic state based on the logic state being associated with a first amount of charge transfer and the complement of the logic state being associated with a second amount of charge transfer that is greater than the first amount of charge transfer.

Some examples of the method 900 and the apparatus described herein may further include operations, circuitry, features, means, or instructions for determining a second logic state stored by a second memory cell, the second memory cell selected by an access line that is common with the memory cell, and writing the second logic state or the complement of the second logic state to the second memory cell based on the determination of whether to write the logic state or the complement of the logic state to the memory cell.

Some examples of the method 900 and the apparatus described herein may further include operations, circuitry, features, means, or instructions for accessing a second memory cell having a second capacitive storage element, determining that the second memory cell stored the logic state based on accessing the second memory cell, and detecting a second charge leakage based on accessing the second memory cell. In some examples, determining whether to write the logic state or the complement of the logic state to the memory cell may be based on determining that the second memory cell stored the logic state and detecting the second charge leakage.

Some examples of the method 900 and the apparatus described herein may further include operations, circuitry, features, means, or instructions for storing an indication of whether the logic state or the complement of the logic state was written to the memory cell. In some examples of the method 900 and the apparatus described herein, the indication may be associated with each memory cell of a set of memory cells that includes the memory cell. In some examples of the method 900 and the apparatus described herein, each memory cell of the set of memory cells may be selected by a common access line.

In some examples of the method 900 and the apparatus described herein, accessing the memory cell may include operations, circuitry, features, means, or instructions for activating a cell selection component for the memory cell, and detecting the charge leakage may be performed at least in part while the cell selection component is activated.

In some examples of the method 900 and the apparatus described herein, determining the logic state stored by the memory cell may include operations, circuitry, features, means, or instructions for latching a signal of an access line associated with the memory cell, and detecting the charge leakage may include operations, circuitry, features, means, or instructions for determining that a voltage of the access line falls below a threshold voltage after the latching.

In some examples of the method 900 and the apparatus described herein, detecting the charge leakage may include operations, circuitry, features, means, or instructions for detecting a flow of charge across a transistor that is electrically connected between the memory cell and a sense component configured to determine that the memory cell stored the logic state.

In some examples of the method 900 and the apparatus described herein, the logic state is associated with a first amount of charge transfer associated with the capacitive storage element and the complement of the logic state is associated with a second amount of charge transfer that may be greater than the first amount of charge transfer.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory cell, a sense component configured for detecting a logic state stored by the memory cell during an access operation, circuitry configured for detecting a charge leakage during the access operation after detecting the logic state, and a controller configured to write a complement of the logic state to the memory cell during the access operation based on the detected charge leakage satisfying a threshold.

In some examples, the controller may be configured to write the complement of the logic state based on the logic state being associated with a first amount of charge transfer and the complement of the logic state being associated with a second amount of charge transfer that is greater than the first amount of charge transfer.

In some examples, the sense component may be configured for detecting the logic state during a read portion of the access operation, and the circuitry may be configured for detecting the charge leakage before a rewrite portion of the access operation.

In some examples, the circuitry includes a second sense component.

In some examples, the sense component includes the circuitry.

In some examples, the sense component may be configured to latch a signal of an access line associated with the memory cell, and the circuitry may be configured to determine that a voltage of the access line falls below a threshold voltage after the latching.

In some examples, the circuitry may be configured to detect a flow of charge across a cascode electrically connected between the memory cell and the sense component.

Another apparatus is described. The apparatus may include a set of memory cells each including a respective storage element and a controller coupled with the set of memory cells and configured to couple the storage element of each of the set of memory cells with a respective one of a set of access lines, determine a respective logic state stored by each of the set of memory cells based on the coupling, determine, after determining the respective logic states, whether a threshold amount of charge leakage is detected on one or more of the set of access lines, select, based on the whether the threshold amount of charge leakage is detected on one or more of the set of access lines, a direct rewrite operation for each of the memory cells or a complementary rewrite operation for each of the memory cells, and perform the selected direct rewrite operation or complementary rewrite operation on each of the set of memory cells.

In some examples, the direct rewrite operation includes writing the respective logic state stored by a respective memory cell and the complementary rewrite operation includes writing a complement of the respective logic state stored by a respective memory cell.

In some examples, a quantity of the set of access lines associated with a detection of the threshold amount of charge leakage and coupled with a memory cell storing the first logic state, and a quantity of the set of access lines associated with a detection of the threshold amount of charge leakage and coupled with a memory cell storing the second logic state.

Some examples may further include storing an indication of whether the direct rewrite operation or the complementary rewrite operation was selected.

In some examples, coupling the storage element of each of the set of memory cells with a respective one of the set of access lines may include operations, circuitry, features, means, or instructions for coupling each memory cell of the set of memory cells with the respective one of the set of access lines based on activating a common selection line.

Some examples may further include couple each memory cell with the respective one of the set of access lines based on activating a cell selection component associated with the respective memory cell, and determine whether the threshold amount of charge leakage is detected on the one or more of the set of access lines at least in part while the cell selection component is activated.

Some examples may further include determining the respective logic state for each of the set of memory cells by latching a signal of a respective signal line associated with the respective memory cell, and determine whether the threshold amount of charge leakage is detected based on comparing a voltage of the respective signal line to a threshold voltage after the latching.

Some examples may further include determining whether the threshold amount of charge leakage is detected on the one or more of the set of access lines may be based on detecting a flow of charge across a transistor that is electrically connected with a respective one of the set of access lines.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions the described functions may be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method comprising:
   accessing a memory cell having a capacitive storage element;
   determining a logic state stored by the memory cell based at least in part on the accessing of the memory cell;
   detecting whether a charge leakage is associated with the memory cell, the charge leakage corresponding to a flow of charge satisfying a threshold during the accessing of the memory cell;
   determining whether to write the determined logic state or a complement of the determined logic state to the memory cell based in part on detecting whether the charge leakage is associated with the memory cell; and
   writing the determined logic state or the complement of the determined logic state to the memory cell, based at least in part on the determination of whether to write the determined logic state or the complement of the determined logic state to the memory cell.

2. The method of claim 1, wherein determining whether to write the determined logic state or the complement of the determined logic state to the memory cell is based at least in part on the determined logic state being associated with a first amount of charge transfer and the complement of the determined logic state being associated with a second amount of charge transfer that is greater than the first amount of charge transfer.

3. The method of claim 1, further comprising:
   determining a second logic state stored by a second memory cell, the second memory cell selected by an access line that is common with the memory cell; and
   writing the determined second logic state or a complement of the determined second logic state to the second memory cell based at least in part on the determination of whether to write the determined logic state or the complement of the determined logic state to the memory cell.

4. The method of claim 1, further comprising:
accessing a second memory cell having a second capacitive storage element;
determining that the second memory cell stored the determined logic state based at least in part on accessing the second memory cell; and
detecting whether a second charge leakage is associated with the second memory cell, the second charge leakage corresponding to a second flow of charge satisfying a second threshold during the accessing of the second memory cell,
wherein determining whether to write the determined logic state or the complement of the determined logic state to the memory cell is based at least in part on the determination that the second memory cell stored the determined logic state and the detection of whether the second charge leakage is associated with the second memory cell.

5. The method of claim 1, further comprising:
storing an indication of whether the determined logic state or the complement of the determined logic state was written to the memory cell.

6. The method of claim 5, wherein the indication is associated with each memory cell of a plurality of memory cells that includes the memory cell.

7. The method of claim 6, wherein each memory cell of the plurality of memory cells is selected by a common access line.

8. The method of claim 1, wherein:
accessing the memory cell comprises activating a cell selection component for the memory cell; and
detecting the charge leakage is performed at least in part while the cell selection component is activated.

9. The method of claim 1, wherein:
determining the logic state stored by the memory cell comprises latching a signal of an access line associated with the memory cell; and
detecting the charge leakage comprises determining that a voltage of the access line falls below a threshold voltage after the latching.

10. The method of claim 1, wherein detecting the charge leakage comprises:
detecting a second flow of charge across a transistor that is electrically connected between the memory cell and a sense component configured to determine that the memory cell stored the logic state.

11. The method of claim 1, wherein the determined logic state is associated with a first amount of charge transfer associated with the capacitive storage element and the complement of the determined logic state is associated with a second amount of charge transfer that is greater than the first amount of charge transfer.

12. An apparatus comprising:
a memory cell;
a sense component configured for detecting a logic state stored by the memory cell during an access operation;
circuitry configured for detecting a charge leakage based on a flow of charge during the access operation; and
a controller configured to write a complement of the logic state to the memory cell during the access operation based at least in part on the flow of charge satisfying a threshold.

13. The apparatus of claim 12, wherein the controller is configured to write the complement of the logic state to the memory cell based at least in part on the logic state being associated with a first amount of charge transfer and the complement of the logic state being associated with a second amount of charge transfer that is greater than the first amount of charge transfer.

14. The apparatus of claim 12, wherein:
the sense component is configured for detecting the logic state during a read portion of the access operation; and
the circuitry is configured for detecting the charge leakage before a rewrite portion of the access operation.

15. The apparatus of claim 12, wherein the circuitry comprises a second sense component.

16. The apparatus of claim 12, wherein the sense component comprises the circuitry.

17. The apparatus of claim 12, wherein:
the sense component is configured to latch a signal of an access line associated with the memory cell; and
the circuitry is configured to detect the charge leakage by determining that a voltage of the access line falls below a threshold voltage after the latching.

18. The apparatus of claim 12, wherein the circuitry is configured to detect the flow of charge across a cascode electrically connected between the memory cell and the sense component.

19. A method comprising:
accessing a memory cell having a capacitive storage element;
determining a logic state stored by the memory cell, based at least in part on whether a flow of charge associated with the memory cell satisfies a first threshold during the accessing of the memory cell;
detecting a charge leakage associated with the memory cell, based at least in part on the flow of charge satisfying a second threshold that is different than the first threshold; and
writing a complement of the determined logic state to the memory cell, based at least in part on the detecting of the charge leakage.

* * * * *